(12) United States Patent
Lee

(10) Patent No.: US 9,905,725 B2
(45) Date of Patent: Feb. 27, 2018

(54) LIGHT EMITTING DIODE AND DATA TRANSMISSION AND RECEPTION APPARATUS

(71) Applicant: Southern Taiwan University of Science and Technology, Tainan (TW)

(72) Inventor: Ming-Lun Lee, Tainan (TW)

(73) Assignee: Southern Taiwan University of Science and Technology, Tainan (TW)

( * ) Notice: Subject to any disclaimer, the term of this patent is extended or adjusted under 35 U.S.C. 154(b) by 258 days.

(21) Appl. No.: 14/864,896

(22) Filed: Sep. 25, 2015

(65) Prior Publication Data

US 2017/0018679 A1 Jan. 19, 2017

(30) Foreign Application Priority Data

Jul. 15, 2015 (TW) .................................. 104122873

(51) Int. Cl.
| | | |
|---|---|---|
| *H04B 10/00* | (2013.01) | |
| *H01L 33/06* | (2010.01) | |
| *H01L 33/08* | (2010.01) | |
| *H04B 10/43* | (2013.01) | |
| *H04B 10/116* | (2013.01) | |
| *H04B 10/70* | (2013.01) | |
| *H01L 33/38* | (2010.01) | |

(52) U.S. Cl.
CPC .............. *H01L 33/06* (2013.01); *H01L 33/08* (2013.01); *H04B 10/116* (2013.01); *H04B 10/43* (2013.01); *H04B 10/70* (2013.01); *H01L 33/382* (2013.01)

(58) Field of Classification Search
CPC ........ H03L 33/06; H03L 33/08; H04B 10/116; H04B 10/43; H04B 10/70
See application file for complete search history.

(56) References Cited

U.S. PATENT DOCUMENTS

| | | | | |
|---|---|---|---|---|
| 8,035,117 B2 * | 10/2011 | DenBaars | ............... | H01L 33/08 257/101 |
| 8,941,329 B2 | 1/2015 | Maxik et al. | | |
| 9,123,560 B2 * | 9/2015 | Lee | ....................... | H01L 25/167 |

(Continued)

FOREIGN PATENT DOCUMENTS

| | | |
|---|---|---|
| TW | 201304188 | 1/2013 |
| TW | M488653 | 10/2014 |
| TW | I470947 | 1/2015 |

OTHER PUBLICATIONS

Sheu et al., "Warm-white light-emitting diode with high color rendering index fabricated by combining trichromatic InGaN emitter with single red phosphor", Optics Express, Apr. 6, 2015, pp. A232-A239.

(Continued)

*Primary Examiner* — Tesfaldet Bocure
(74) *Attorney, Agent, or Firm* — JCIPRNET

(57) ABSTRACT

A light emitting diode, including a semiconductor epitaxial structure, a first electrode and a second electrode is provided. The semiconductor epitaxial structure includes a plurality stacked light-emitting layers, and each of the light-emitting layers respectively emits different range of wavelength of light. The first electrode is electrically connected to the semiconductor epitaxial structure. The second electrode is electrically connected to the semiconductor epitaxial structure. Furthermore, a data transmission and reception apparatus is provided.

20 Claims, 14 Drawing Sheets

(56) References Cited

U.S. PATENT DOCUMENTS

| | | | |
|---|---|---|---|
| 9,312,455 B2* | 4/2016 | Yen | H01L 33/505 |
| 9,590,139 B1* | 3/2017 | Lai | H01L 33/06 |
| 2002/0063329 A1* | 5/2002 | Horie | H01L 33/642 |
| | | | 257/706 |
| 2007/0069220 A1* | 3/2007 | Ogihara | H01L 25/0753 |
| | | | 257/79 |
| 2008/0093593 A1 | 4/2008 | Ryu | |
| 2009/0214225 A1 | 8/2009 | Nakagawa et al. | |
| 2010/0054748 A1 | 3/2010 | Sato | |
| 2012/0040515 A1* | 2/2012 | Takahashi | B82Y 20/00 |
| | | | 438/478 |
| 2012/0223660 A1* | 9/2012 | Choi | H01L 33/50 |
| | | | 315/326 |
| 2013/0056745 A1* | 3/2013 | Chen | H01L 21/02381 |
| | | | 257/76 |
| 2014/0270791 A1 | 9/2014 | Hyde et al. | |
| 2015/0054415 A1 | 2/2015 | Maxik et al. | |
| 2016/0254410 A1* | 9/2016 | Mirhosseini-Schubert | H01L 33/08 |
| | | | 348/371 |
| 2016/0372893 A1* | 12/2016 | McLaurin | H01L 24/95 |

OTHER PUBLICATIONS

Wang et al., "Demonstration of 575-Mb/s downlink and 225-Mb/s uplink bi-directional SCM-WDM visible light communication using RGB LED and phosphor-based LED", Optics Express, Jan. 14, 2013, pp. 1203-1208.

"Office Action of Taiwan Counterpart Application," dated Aug. 9, 2016, p. 1-p. 6.

* cited by examiner

LIGHT EMITTING DIODE AND DATA TRANSMISSION AND RECEPTION APPARATUS

CROSS-REFERENCE TO RELATED APPLICATION

This application claims the priority benefit of Taiwan application serial no. 104122873, filed on Jul. 15, 2015. The entirety of the above-mentioned patent application is hereby incorporated by reference herein and made a part of this specification.

BACKGROUND OF THE INVENTION

1. Field of the Invention

The invention relates to a light emitting diode and a data transmission and reception apparatus, and particularly relates to a light emitting diode and a data transmission and reception apparatus suitable for visible light communications (VLC).

2. Description of Related Art

Since light emitting diodes (LED) are more and more commonly used for illumination nowadays, the potential of LED in the field of visible light communications (VLC) has drawn people's attention due to its characteristic of high-speed modulation. For example, the visible light emitted by one or more LEDs may serve to transmit data in a VLC system.

However, it is still challenging to use the conventional white LEDs in the field of VLC. The conventional white LEDs may be categorized into two types, one is the phosphor white light emitting diodes, and the other is the white light emitting diodes using red, green, and blue light emitting diode chips. The conventional phosphor white light emitting diode includes a blue light emitting diode and a yellow phosphor. The blue light emitting diode emits blue light to excite the yellow phosphor, and the yellow light emitted by the yellow phosphor after the yellow phosphor absorbs a portion of the blue light is combined with another portion of the blue light to form the white light. In general, the light emitting mechanism for the phosphor to be excited by light is termed as phosphorescence. The lifetime of phosphorescence is approximately in a range from $10^{-3}$ to $10^2$ seconds, and the modulation bandwidth of the light emitted by phosphor is limited, normally not exceeding 10 Mbps. Thus, it is rather difficult to use the phosphor white light emitting diode as a high-bit-rate data transmitter in a VLC system.

Compared with the phosphor white light emitting diode, the overall modulation bandwidth of the white light emitted by the white light emitting diode formed by the red, green and blue light emitting diode chips is not influenced by the phosphor having a slower responding speed and able to provide a higher modulation bandwidth. Thus, such white light emitting diode may be used as a high-bit-rate data transmitter and an illumination device. However, from the perspective of cost, such white light emitting diode is formed by three different light emitting diodes (i.e., red, green, and blue light emitting diodes), so it requires more light emitting diodes and more kinds of light emitting diodes. Thus, the driving circuit thereof is more complicated, and the cost thereof is also higher. Furthermore, since the three kinds of light emitting diodes have different life time, after the white light emitting diode is used for a while, the light output of the white light in terms of color temperature and power is changed to differ from the initial state. As a result, color sensors and feedback circuits need to be used to correct the white light output, and the initial driving condition needs to be changed, so as to achieve the initial color temperature of the white light of the white light emitting diode.

Thus, developing a low-cost light emitting diode suitable for the VLC system is certainly an issue for researches to work on.

SUMMARY OF THE INVENTION

The invention provides a light emitting diode and a data transmission and reception apparatus suitable for a visible light communication system and having a lower manufacturing cost.

The light emitting diode (LED) chip of the invention is suitable for applying to a visible light communication (VLC) system. The LED chip includes a semiconductor epitaxial structure, a first electrode, and a second electrode. The semiconductor epitaxial structure includes a plurality of stacked light emitting layers for emitting a spectrum with at least three wavelength peaks, and the stacked light emitting layers include at least two quantum well layers for emitting at least two of the wavelength peaks. The first electrode is electrically connected to the semiconductor epitaxial structure. The second electrode is electrically connected to the semiconductor epitaxial structure.

According to an embodiment of the invention, the semiconductor epitaxial structure further includes a first type doped semiconductor layer and a second type doped semiconductor layer. The light emitting layers are stacked between the first type doped semiconductor layer and the second type doped semiconductor layer.

According to an embodiment, the semiconductor epitaxial structure further includes a plurality of spacers, and each of the spacers is located between adjacent light emitting layers.

According to an embodiment of the invention, the light emitting layers include a first light emitting layer, a second light emitting layer, and a third light emitting layer. The first light emitting layer, the second light emitting layer, and the third light emitting layer respectively emit a light beam with a range of wavelength from 600 nanometers to 750 nanometers, a light beam with a range of wavelength from 500 nanometers to 600 nanometers, and a light beam with a range from 420 nanometers to 500 nanometers.

According to an embodiment, the semiconductor epitaxial structure further includes a plurality of stacked light emitting units. Each of the light emitting units includes a first type doped semiconductor layer and a second type doped semiconductor layer. In addition, each of the light emitting layers is located between the first type doped semiconductor layer and the second type doped semiconductor layer.

According to an embodiment of the invention, the light emitting layers in each of the light emitting units respectively emit a light beam with a range of wavelength from 600 nanometers to 750 nanometers, a light beam with a range of wavelength from 500 nanometers to 600 nanometers, and a light beam with a range from 420 nanometers to 500 nanometers.

According to an embodiment of the invention, one of the light emitting layers includes a wavelength conversion layer, while remaining of the light emitting layers include a plurality of electroluminescent quantum well layers.

According to an embodiment of the invention, the electroluminescent quantum well layers include a first electroluminescent quantum well layer and a second electroluminescent quantum well layer.

According to an embodiment, the semiconductor epitaxial structure further includes a plurality of tunnel junction layers, and each of the tunnel junction layers is located between adjacent light emitting units.

According to an embodiment of the invention, the light emitting layers include an electroluminescent quantum well layer and a plurality of wavelength conversion layers.

According to an embodiment of the invention, the light emitting diode further includes a first type doped semiconductor layer and a second type doped semiconductor layer. The electroluminescent quantum well layer is located between the first type doped semiconductor layer and the second type doped semiconductor layer.

According to an embodiment of the invention, the electroluminescent quantum well layer emits a light beam with a range of wavelength from 420 nanometers to 500 nanometers, and the wavelength conversion layers respectively emit a light beam with a range of wavelength from 500 nanometers to 600 nanometers and a light beam with a range of wavelength from 600 nanometers to 750 nanometers.

According to an embodiment of the invention, the wavelength conversion layers include a first photoluminescent quantum well layer and a second photoluminescent quantum well layer.

According to an embodiment of the invention, the wavelength conversion layers include a first photoluminescent quantum well layer and a phosphor layer.

According to an embodiment of the invention, the electroluminescent quantum well layer emits a light beam with a range of wavelength from 320 nanometers to 420 nanometers, and the wavelength conversion layers respectively emit a light beam with a range of wavelength from 420 nanometers to 500 nanometers, a light beam with a range of wavelength from 500 nanometers to 600 nanometers, and a light beam with a range of wavelength from 600 nanometers to 750 nanometers.

According to an embodiment of the invention, the wavelength conversion layers include a first photoluminescent quantum well layer, a second photoluminescent quantum well layer, and a third photoluminescent quantum well layer.

According to an embodiment of the invention, the wavelength conversion layers include a first photoluminescent quantum well layer, a first phosphor layer, and a second phosphor layer.

According to an embodiment of the invention, the wavelength conversion layers include a first photoluminescent quantum well layer, a second photoluminescent quantum well layer, and a phosphor layer.

A data transmission and reception apparatus according to an embodiment of the invention includes a data transmission module and a data reception module. The data transmission module includes a light emitting diode chip according to any of the embodiments of the invention. The data reception module receives a light beam emitted by the at least one light emitting diode chip.

Based on above, in the light emitting diode chip according to the embodiments of the invention, one chip has a plurality of the light emitting layers, and the light emitting layers respectively emit light beams with different ranges of wavelength. In addition, the single-chip LED at least emits two wavelength peaks from the quantum well layers. Thus, the light emitting diode according to the embodiments of the invention has a higher modulation bandwidth and is suitable for a visible light communication system. Besides, the light beams emitted by the light emitting diode according to the embodiments of the invention have a higher reliability, and the light emitting diode according to the embodiments of the invention does not require a complicated driving circuit. Thus, the light emitting diode according to the embodiments of the invention has a lower production cost. In addition, the data transmission and reception apparatus according to the embodiments of the invention uses the light emitting diode according to the embodiments of the invention as the data transmission module and is suitable for a visible light communication system.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
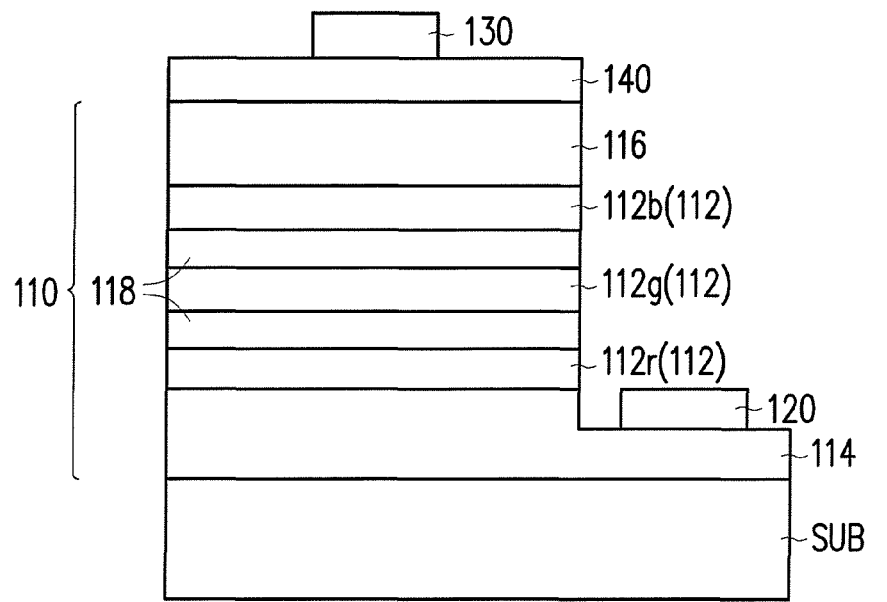
FIGS. 1-14 are cross-sectional schematic views illustrating light emitting diodes according to different embodiments of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a cross-sectional schematic view illustrating a light emitting diode 100 according to an embodiment of the invention. Referring to FIG. 1, the light emitting diode 100 of the invention is a horizontal light emitting diode. The light emitting diode 100 includes a semiconductor epitaxial structure 100, a first electrode 120, and a second electrode 130. The semiconductor epitaxial structure 100 includes a plurality of stacked light emitting layers 112, and the light emitting layers 112 respectively emit light beams with different ranges of wavelength. The first electrode 120 is electrically connected to the semiconductor epitaxial structure 110. The second electrode 130 is electrically connected to the semiconductor epitaxial structure 110.

Referring to FIG. 1 again, the light emitting diode 100 of this embodiment further includes a substrate SUB. A material of the substrate SUB is, for example, sapphire, SiC, AlN, or Si. However, regarding the material of the substrate SUB, the invention is not limited to the aforesaid materials. The semiconductor epitaxial structure 100 is located on the substrate SUB.

In this embodiment, materials of the first electrode 120 and the second electrode 130 are, for example, Ni/Au, Ti/Au, Cr/Au, indium tin oxide (ITO), or other conductive materials suitable for the light emitting diode 100. However, the invention is not limited to the aforesaid materials.

Specifically, the semiconductor epitaxial structure 110 of this embodiment further includes a first type doped semiconductor layer 114 and a second type doped semiconductor layer 116. In addition, the first electrode 120 is located on the first type doped semiconductor layer 114, and the second electrode 130 is located on the second type doped semiconductor layer 116. A transparent conductive layer 140 is further disposed between the second electrode 130 and the second type doped semiconductor layer 116. A material of the transparent conductive layer 140 includes indium tin oxide (ITO), indium zinc tin oxide (IZTO), germanium zinc oxide (GZO), aluminum zinc oxide (AZO), or other materials exhibiting a current spreading effect and allowing light to pass through. Besides, a material of one of the first type doped semiconductor layer 114 and the second type doped semiconductor layer 116 of this embodiment includes n-GaN, while a material of the other of the first type doped semiconductor layer 114 and the second type doped semiconductor layer 116 of this embodiment includes p-GaN. In addition, a material doped to the n-GaN includes Si or Ge, while a material doped to the p-GaN includes Mg or Zn, and a formation process thereof includes performing a metalorganic chemical vapor deposition (MOCVD) process, or a molecular beam epitaxy (MBE) process, etc., for example. However, the invention is not limited thereto.

In this embodiment, the light emitting layers 112 are stacked between the first type doped semiconductor layer 114 and the second type doped semiconductor layer 116. For example, the light emitting layers 112 includes a first light emitting layer 112r, a second light emitting layer 112g, and a third light emitting layer 112b, and the first light emitting layer 112r, the second light emitting layer 112g, and the third light emitting layer 112b are sequentially stacked on the first type doped semiconductor layer 114. In this embodiment, the first light emitting layer 112r emits a light beam with a range of wavelength from 600 nanometers to 750 nanometers (a range of wavelength of red light), the second light emitting layer 112g emits a light beam with a range of wavelength from 500 nanometers to 600 nanometers (a range of wavelength of green light), the third light emitting layer 112b emits a light beam with a range of wavelength from 420 nanometers to 500 nanometers (a range of wavelength of blue light). In other embodiments, the first light emitting layer 112r, the second light emitting layer 112g, and the third light emitting layer 112b may also emit light beams with ranges of wavelength different from those described above. Taking the first light emitting layer 112r as an example, the first light emitting layer 112r may also emit a light beam with a range of wavelength from 500 nanometers to 600 nanometers or a range of wavelength from 420 nanometers to 500 nanometers. Similarly, the second light emitting layer 112g and the third light emitting layer 112b may also emit light beams with ranges of wavelength different from those described above. Namely, the invention is not limited to those described here. Moreover, the semiconductor epitaxial structure 110 further includes a plurality of spacers 118. Each of the spacers 118 is located between the light emitting layers 112 such that the light emitting layers 112 do not contact each other. In addition, a material of the spacers 118 includes GaN. The light emitting layers 112 and the spacers 118 may be formed by performing an MOCVD process or an MBE process, etc. However, the invention is not limited thereto.

In an embodiment, each of the light emitting layers 112 is in a single quantum well (SQW) structure, for example. In other embodiments, each of the light emitting layers 112 may also be in a multiple quantum well (MQW) structure, for example. In addition, the MQW structure includes a plurality of quantum wells and a plurality of quantum barriers that are repetitively and alternately disposed. With the design, the light emitting efficiency of the light emitting diode 100 is able to be further improved. Besides, in this embodiment, each of the light emitting layers 112 includes a quantum well layer formed by a plurality of indium gallium nitride (InGaN) layers and a plurality of gallium nitride (GaN) layers that are alternately stacked. By designing the proportion of indium or gallium, the light emitting layers 112 may emit light with different ranges of wavelength. It should be noted that the light emitting layers 112 are not limited to be formed by the quantum well layers formed of InGaN or GaN. In other embodiments, the requirement is met as long as the materials of the light emitting layers 112 are chosen to be compositions of compound semiconductors capable of emitting light beams with desired ranges of wavelength, and such choice still falls within the protection scope of the invention.

It should be noted that, in the light emitting diode 100 of the embodiment, three light emitting layers capable of emitting light beams with different ranges of wavelength are grown on the same substrate. In other words, one single light emitting diode chip is capable of emitting light beams in three different colors (i.e., red light, green light, and blue light). Thus, with a suitable parameter design of the light emitting layer, desirable white light can be obtained after a current is injected to the light emitting diode 100 at a suitable voltage. Compared to the conventional phosphor light emitting diode, since the light beams are emitted through electroluminescence of the quantum well layers, the whole modulation bandwidth is not influenced by the phosphor powder with a slower responding speed. The light emitting diode 100 has a higher modulation bandwidth, and is suitable for a data emission module with a higher bit rate. Besides, compared to the conventional white light emitting diode using red, green, and blue light emitting diode chips, a single light emitting diode 100 of this embodiment is capable of emitting light in different colors. Thus, the light emitting diode of this embodiment avoids a complicated driving circuit, and has a lower manufacturing cost.

Even though the light emitting diode 100 is described as having three light emitting layers (light emitting layers 112r, 112g, and 112b) as an example, the light emitting diode 100 may also have two light emitting layers or four or more light emitting layers in other embodiments not shown herein. Thus, light emitting diodes with such designs still fall within the protection scope of the present application.

It should be noted herein that some reference numerals and some contents of the above embodiment are used in the following embodiments to indicate like or similar components and to avoid repeated description of the same technical contents. Reference is made to the previous embodiment for like or similar components, and relevant descriptions are not repeated in the following embodiments.

Figure 2:
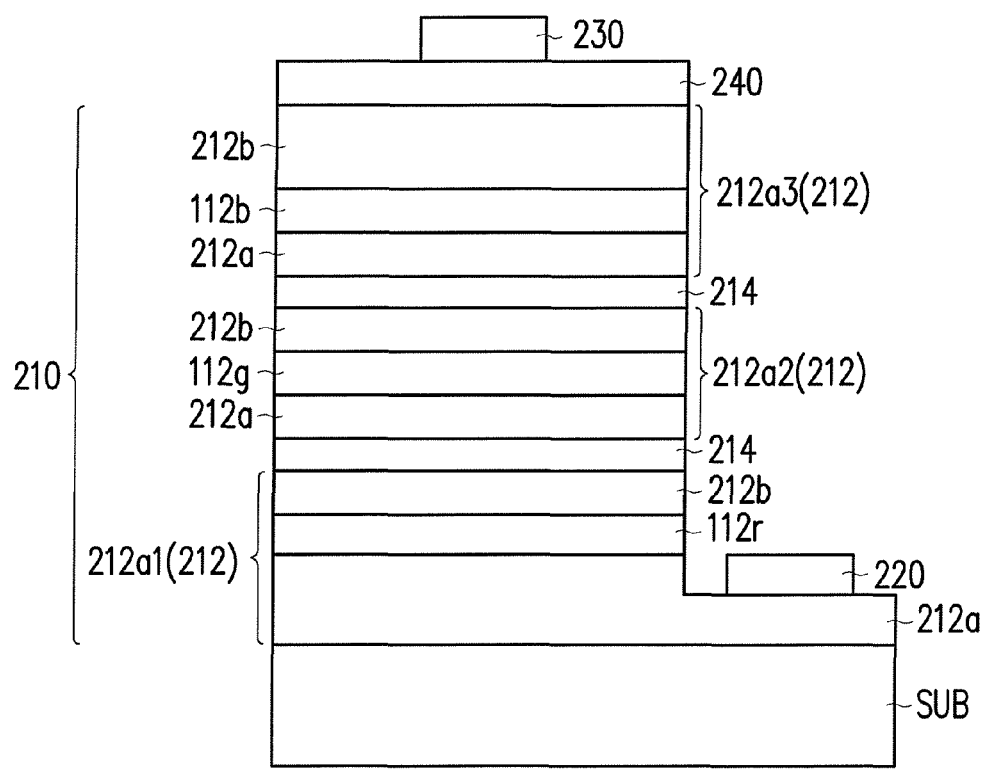

FIG. 2 is a cross-sectional schematic view illustrating a light emitting diode according to another embodiment of the invention. A light emitting diode 200 shown in FIG. 2 and the light emitting diode 100 shown in FIG. 1 are similar, except for a main difference that a semiconductor epitaxial structure 210 includes a plurality of stacked light emitting units 212 and a plurality of tunnel junction layers 214. Each of the light emitting units 212 includes a first type doped semiconductor layer 212a and a second type doped semiconductor layer 212b. In addition, each of the light emitting layers 112 is located between the first type doped semiconductor layer 212a and the second type doped semiconductor layer 212b. In other words, each of the light emitting layers 112r, 112g, and 112b is located between the corresponding first type doped semiconductor layer 212a and the corresponding second type doped semiconductor layer 212b. Besides, each of the tunnel junction layers 214 is located between adjacent light emitting units 212. In addition, each of the tunnel junction layers 214 is formed by a structure formed of two or multiple layers of $Al_xIn_yGa_{1-x-y}N/Al_uIn_vGa_{1-u-v}N$, and a thickness thereof is in a range from 2 nanometers to 200 nanometers. Furthermore, the tunnel junction layer 214 may be formed by forming a $p^+/n^+$ junction by performing a heavy doping process, or formed by performing a polarization-induced process or other suitable processes capable of generating a tunneling effect. Still, the invention is not limited to the aforesaid processes.

Referring to FIG. 2 again, in this embodiment, the light emitting units 212 include a first light emitting unit 212a1, a second light emitting unit 212a2, and a third light emitting unit 212a3. In addition, the first light emitting unit 212a1, the second light emitting unit 212a2, and the third light emitting unit 212a3 are sequentially stacked on the substrate SUB. In addition, the first light emitting layer 112r is located between the first type doped semiconductor layer 212a and the second type doped semiconductor layer 212b in the first light emitting unit 212a1, the second light emitting layer 112g is located between the first type doped semiconductor layer 212a and the second type doped semiconductor layer 212b in the second light emitting unit 212a2, and the third light emitting layer 112b is located between the first type doped semiconductor layer 212a and the second type doped semiconductor layer 212b in the third light emitting unit 212a3. The first electrode 220 is located on the first type doped semiconductor layer 212a of the first light emitting unit 212a1, and the second electrode 230 is located on the second type doped semiconductor layer 212b of the third light emitting unit 212a3. In this embodiment, the light emitting diode 200 further includes a transparent conductive layer 240, and the transparent conductive layer 240 is located between the second electrode 230 and the third light emitting unit 212a3.

It should be mentioned that, in this embodiment, each of the tunnel junction layers 214 is located between adjacent light emitting units 212, so as to separate the light emitting units 212 from each other. Specifically, by using two tunnel junction layers 214 to serially connect the first light emitting unit 212a1, the second light emitting unit 212a2, and the third light emitting unit 212a3, a tandem white LED is formed. Such design may effectively improve the light emitting efficiency of the light emitting diode 200.

Figure 3:
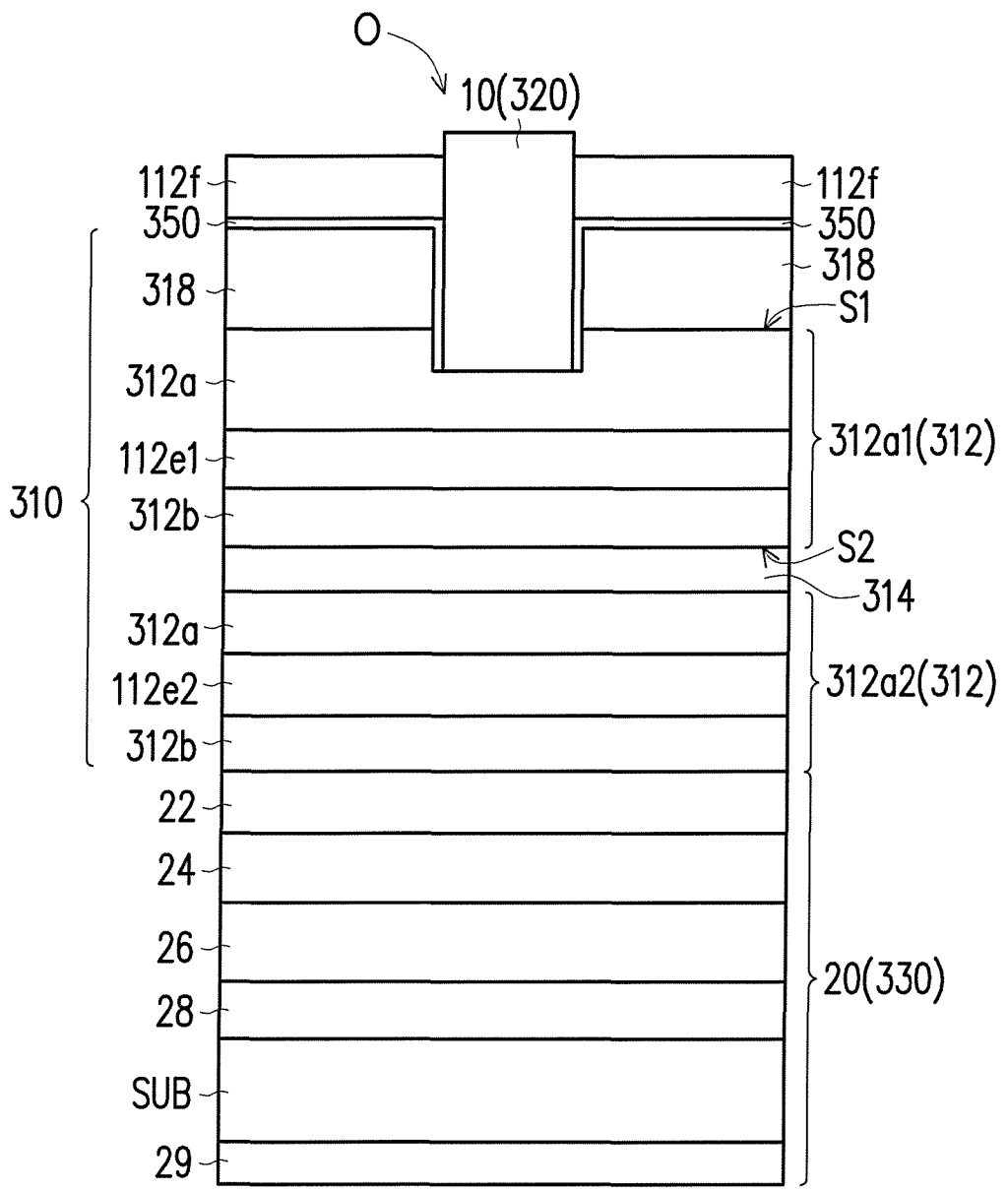

FIG. 3 is a cross-sectional schematic view illustrating a light emitting diode according to another embodiment of the invention. A light emitting diode 300 shown in FIG. 3 and the light emitting diode 200 shown in FIG. 2 are similar, except for a main difference that the light emitting diode 300 is a vertical light emitting diode, and a first electrode 320 of the light emitting diode 300 includes a conductive plug 10, and a second electrode 330 includes a reflective conductive structure 20. Moreover, one of the light emitting layers 112 includes a wavelength conversion layer, while remaining of the light emitting layers 112 include a plurality of electroluminescent quantum well layers. Specifically, the electroluminescent quantum well layers include a first electroluminescent quantum well layer 112e1 and a second electroluminescent quantum well layer 112e2, and the wavelength conversion layer includes a phosphor layer 112f. The first electroluminescent quantum well layer 112e1 and the second electroluminescent quantum well layer 112e2 are located between a corresponding first type doped semiconductor layer 312a and a corresponding second type doped semiconductor layer 312b. More specifically, the first electroluminescent quantum well layer 112e1 is located between the first type doped semiconductor layer 312a and the second type doped semiconductor layer 312b of a first light emitting layer 312a1, and the second electroluminescent quantum well layer 112e2 is located between the first type doped semiconductor layer 312a and the second type doped semiconductor layer 312b of a second light emitting unit 312a2. In other words, compared with the light emitting diode 200, the light emitting diode 300 has two stacked light emitting units 312, and a tunnel junction layer 314 is located between the first light emitting unit 312a1 and the second light emitting unit 312a2. Besides, the first light emitting unit 312a1 has a first surface S1 and a second surface S2 opposite to the first surface S1. The phosphor layer 112f is located on the first surface S1, and the second light emitting unit 312a2 is located on the second surface S2. The conductive plug 10 is located on the first surface S1, and is electrically connected to a semiconductor epitaxial structure 310. The reflective conductive structure 20 is located on the second light emitting unit 312a2. In addition, the second light emitting unit 312a2 is located between the reflective conductive structure 20 and the first light emitting unit 312a1. The reflective conductive structure 20 is electrically connected to the semiconductor epitaxial structure 310.

Specifically, in this embodiment, a spacer 318 is located between the phosphor layer 112f and the first light emitting unit 312a1. A material of the spacer 318 includes undoped GaN (u-GaN). In addition, the light emitting diode 300 of this embodiment further includes an opening O. The opening O penetrates the spacer 318 and a portion of the first type doped semiconductor layer 312a of the first light emitting unit 312a1. Moreover, the opening O may be formed by performing a selective dry etching process, such as a plasma etching process. The conductive plug 10 is located in the opening O and forms an ohmic contact with the first type doped semiconductor layer 312a in the first light emitting unit 312a1, so as to electrically connect the semiconductor epitaxial structure 310. In addition, a material of the conductive plug 10 includes an alloy of Ti, Al, Ni, and Au, or an alloy including at least two of Ti, Al, Cr, and Au. In addition, an insulating layer 350 is disposed on sidewalls of the opening O and a surface of the spacer 318 to electrically isolate the conductive plug 10 and the spacer 318. In addition, a material of the insulating layer 350 includes silicon dioxide ($SiO_2$) or other electrically insulating materials.

Furthermore, in this embodiment, the reflective conductive structure 20 includes a metal reflective layer 22, a diffusion barrier layer 24, a metal adhesive layer 26, a first ohm contact layer 28, the substrate SUB, and a second ohm contact layer 29 that are sequentially arranged. The metal reflective layer 22 is electrically connected to the second light emitting unit 312a2, and may effectively emit a portion of light beams emitted by the light emitting layers 112 toward a predetermined light emitting direction (e.g., a direction toward the first surface S1), so as to improve the light extraction efficiency of the light emitting diode 300. A material of the metal reflective layer 22 includes an alloy of Ni and Ag. The diffusion barrier layer 24 prevents diffusion of the metal adhesive layer 26 and the metal reflective layer 22 with respect to each other. A material of the diffusion barrier layer 24 includes an alloy of TiW and/or Pt. It should be noted that the metal reflective layer 22 and the diffusion barrier layer 24 may be formed on the semiconductor epitaxial structure 310 by performing an evaporation process, and the metal reflective layer 22 may simultaneously serve as a metal layer that forms an ohmic contact with the second type doped semiconductor layer 312b and a reflective mirror. In generally, a material of the second type doped semiconductor layer 312b that contacts the metal reflective layer 22 includes p-GaN. However, the invention is not limited thereto. The metal adhesive layer 26 is electrically and physically connected to the first ohmic contact layer 28, and a material of the metal adhesive layer 28 includes indium (In). The first ohmic contact layer 28 and the second ohmic contact layer 29 are respectively located at two sides of the substrate SUB and form ohmic contacts with the substrate SUB. In addition, a material of the first ohmic contact layer 28 and the second ohmic contact layer 29 includes an alloy of Ti and Au, and a material of the substrate SUB includes silicon (Si). It should be noted that, in other embodiments, the reflective conductive structure 20 may also be other structures having reflective and conductive functions. The reflective conductive structure here merely serves as an example, and the invention is not limited thereto.

Then, in this embodiment, the first electroluminescent quantum well layer 112e1 emits a light beam with a range of wavelength from 420 nanometers to 500 nanometers, and the second electroluminescent quantum well layer 112e2 emits a light beam with a range of wavelength from 500 nanometers to 600 nanometers. The phosphor layer 112f emits a light beam with a range of wavelength from 600 nanometers to 750 nanometers. In addition, a material of the phosphor layer 112f is Eu-doped (SrCa) $AlSiN_3$ or other red light phosphor capable of emitting a light beam with a range of wavelength from 600 nanometers to 750 nanometers. In other embodiments, the first electroluminescent quantum well layer 112e1 emits a light beam with a range of wavelength from 500 nanometers to 600 nanometers, and the second electroluminescent quantum well layer 112e2 emits a light beam with a range of wavelength from 420 nanometers to 500 nanometers. However, the invention is not limited thereto. More specifically, after a voltage is applied to the light emitting diode 300 of this embodiment to inject a current, the first electroluminescent quantum well layer 112e1 emits a light beam with a range of wavelength from 420 nanometers to 500 nanometers after being excited by the current, the second electroluminescent quantum well layer 112e2 emits a light beam with a range of wavelength from 500 nanometers to 600 nanometers after being excited by the current, and the phosphor layer 112f absorbs a portion of the light beam emitted by the first electroluminescent quantum well layer 112e1 or the second electroluminescent quantum well layer 112e2 and is excited to emit a light beam with a range of wavelength from 600 nanometers to 750 nanometers.

It should be noted that, compared with the horizontal light emitting diode, the light emitting diode 300 of this embodiment is capable of dissipating a large amount of heat and improves the light emitting efficiency of the light emitting diode 300. Moreover, compared with the sapphire substrate used in the conventional light emitting diode, the silicon substrate used in the light emitting diode 300 of this embodiment has a higher thermal conductive coefficient. Thus, the heat dissipation ability of the light emitting diode 300 is effectively improved, thereby further elongating the lifetime of the light emitting diode 300.

Figure 4:
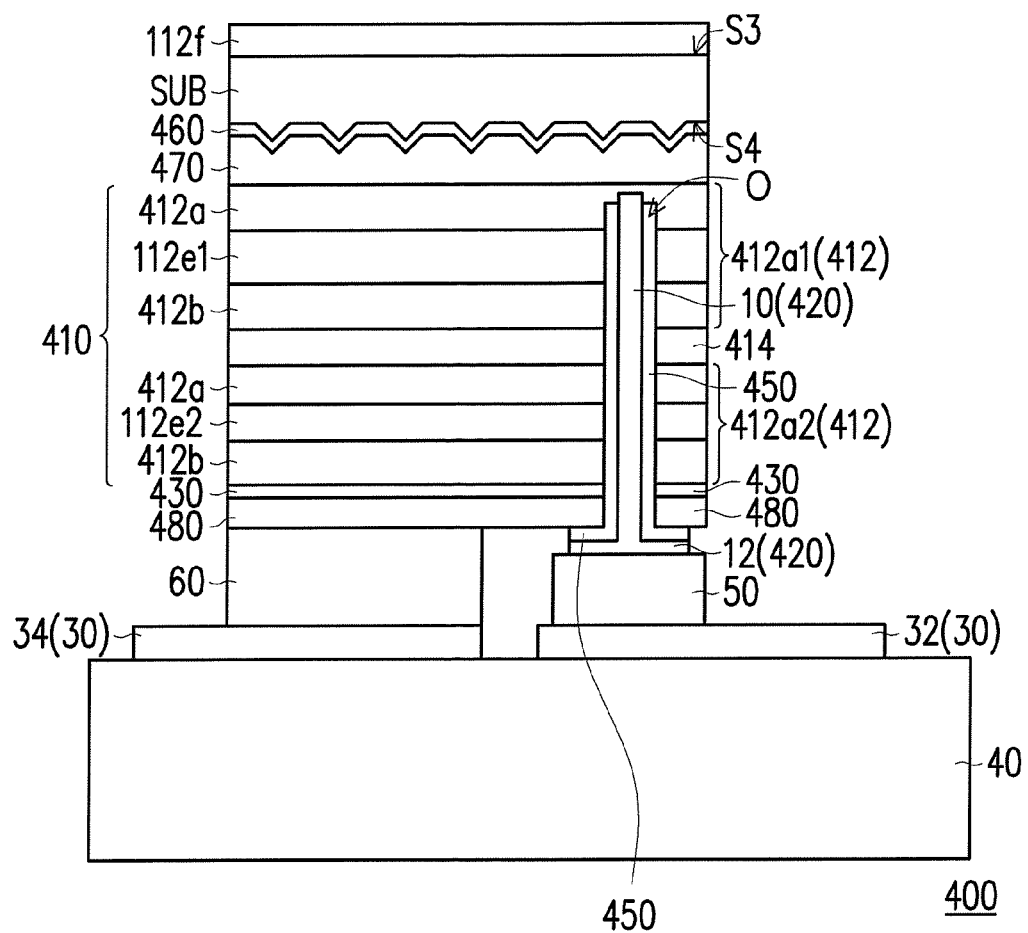

FIG. 4 is a cross-sectional schematic view illustrating a light emitting diode according to another embodiment of the invention. A light emitting diode 400 shown in FIG. 4 and the light emitting diode 300 shown in FIG. 3 are similar, except for a main difference that the light emitting diode 400 is a flip-chip light emitting diode. More specifically, the light emitting diode 400 may be bonded to a carrying substrate 40 by using an electrode pad structure 30. Then, a first electrode 420 and a second electrode 430 are located at the same side of a semiconductor epitaxial structure 410. In addition, the first electrode 420 is electrically connected to a first light emitting unit 412a1, and the second electrode 430 is electrically connected to a second light emitting unit 412a2. Then, the substrate SUB is located between the phosphor layer 112f and the first light emitting unit 412a1. Besides, the light emitting diode 400 further includes a metal reflective layer 480. In addition, the second electrode 430 is located between the metal reflective layer 480 and the second light emitting unit 412a2.

Specifically, the light emitting diode 400 further includes the opening O. The opening O penetrates the metal reflective layer 480, the second electrode 430, the second light emitting unit 412a2, a tunnel junction layer 414, a second type doped semiconductor layer 412b of the first light emitting unit 412a1, the first electroluminescent quantum well layer 112e1 and a portion of a first type doped semiconductor layer 412a in the first light emitting unit 412a1. The first electrode 420 includes the conductive plug 10 and an extension portion 12 extending outward from the conductive plug 10. The conductive plug 10 is located in the opening O, forms an ohmic contact with the first type doped semiconductor layer 412a in the first light emitting element 412a1, and is electrically connected to the semiconductor epitaxial structure 410. Furthermore, an insulating layer 450 is disposed on the sidewalls of the opening O and a portion of a surface of the metal reflective layer 480.

Referring to FIG. 4 again, the light emitting diode 400 of this embodiment is electrically connected to the electrode pad structure 30 through a first conductive solder 50 and a second conductive solder 60. More specifically, the first conductive solder 50 is electrically connected with the extension portion 12, and the second conductive solder 60 is electrically connected with the metal reflective layer 480. In addition, materials of the first conductive solder 50 and the second conductive solder 60 include Au, Sn or AuSn alloy. Besides, the electrode pad structure 30 includes a first electrode pad 32 and a second electrode pad 34, and the first electrode pad 32 and the second electrode pad 34 are located on the carrying substrate 40. In addition, the first electrode pad 32 is electrically connected to the first conductive solder 50, and the second electrode pad 34 is electrically connected to the second conductive solder 60. A material of the carrying substrate 40 includes AlN or other materials having a high thermal conductivity coefficient. The electrode pad structure 30 and the carrying substrate 40 may be considered as a submount for flip-chip packaging.

Besides, in this embodiment, the substrate SUB has a third surface S3 and a fourth surface S4 opposite to the third surface S3. The substrate SUB may be a patterned sapphire substrate (PSS). In addition, the surface where the substrate SUB is patterned on the fourth surface S4, and the substrate SUB has a surface pattern (e.g., a bumpy pattern). It should be noted that the patterned sapphire substrate may scatter the light beams emitted by the light emitting diode 400, so as to effectively increase the light extraction efficiency of the light emitting diode 400. In addition, the light emitting diode 400 of this embodiment further includes a nucleation layer 460 and a buffer layer 470, and the nucleation layer 460 and the buffer layer 470 are located on the fourth surface S4. Moreover, the nucleation layer 460 is located between the substrate SUB and the buffer layer 470. A material of the nucleation layer 460 includes AlN, and the nucleation layer 460 may be formed by performing a sputtering process, a vacuum thermal evaporation (VTE) process, or an E-beam evaporation process. A material of the buffer layer 470 includes undoped GaN or AlGaN. The nucleation layer 460 and the buffer layer 470 serve to prevent epitaxial point defects and threading dislocation from being subsequently generated, so as to improve the quality of epitaxy afterwards.

It should be noted that the light emitting diode 400 of this embodiment is a flip-chip light emitting diode, and the heat generated by the light emitting layer may be dissipated to the external environment by the carrying substrate having a high thermal conductivity coefficient after being transmitted via the conductive solders at the bottom. In this way, the heat dissipation effect is improved significantly. Besides, the flip-chip light emitting diode does not require manufacturing processes such as wiring, and the space required by the light emitting diode 400 is significantly reduced as well.

Figure 5:
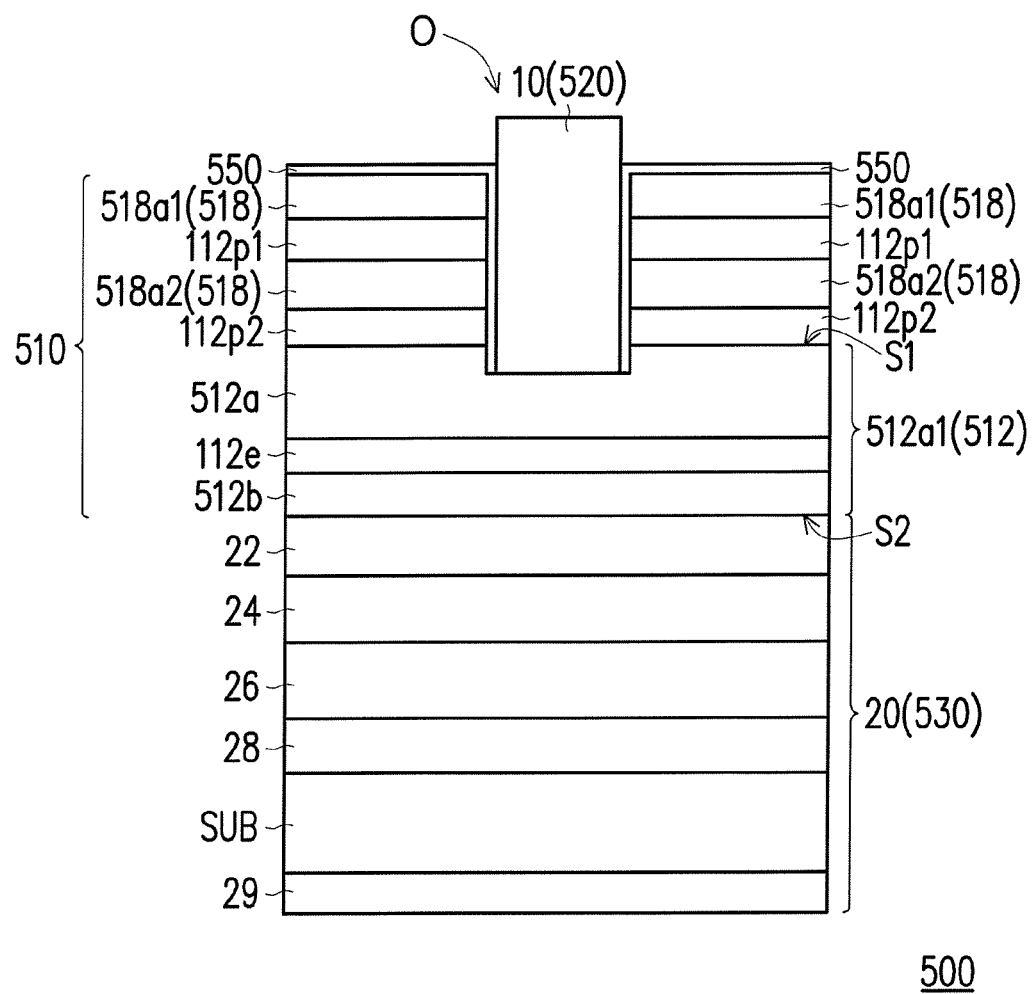

FIG. 5 is a cross-sectional schematic view illustrating a light emitting diode according to another embodiment of the invention. A light emitting diode 500 shown in FIG. 5 and the light emitting diode 300 shown in FIG. 3 are similar, except for a main difference that the light emitting layers include an electroluminescent quantum well layer 112e and a plurality of wavelength conversion layers. More specifically, the wavelength conversion layers include a first photoluminescent quantum well layer 112p1 and a second photoluminescent quantum well layer 112p2. In addition, the electroluminescent quantum well layer 112e is located between a first type doped semiconductor layer 512a and a second type doped semiconductor layer 512b. In other words, in this embodiment, the electroluminescent quantum well layer 112e, the first type doped semiconductor layer 512a, and the second type doped semiconductor layer 512b may be considered as one light emitting unit 512. In other words, the light emitting diode 500 has a first light emitting unit 512a1. The light emitting unit 512a1 has the first surface S1 and the second surface S2 opposite to the first surface S1. The second photoluminescent quantum well layer 112p2 is located between the first photoluminescent quantum well layer 112p1 and the first light emitting unit 512a1. The reflective conductive structure 20 is located on the second surface S2, and is electrically connected to the first light emitting unit 512a1. Moreover, a semiconductor epitaxial structure 510 further includes a plurality of spacers 518. In this embodiment, the spacers 518 are two spacers 518, for example, namely a first spacer 518a1 and a second spacer 518a2. The first spacer 518a1 is located at a side of the first photoluminescent quantum well layer 112p1, and the second spacer 518a2 is located at the other side of the first photoluminescent quantum well layer 112p1. In addition, the second spacer 518a2 is located between the first photoluminescent quantum well layer 112p1 and the second photoluminescent quantum well layer 112p2. In other words, the spacers 518, the first photoluminescent quantum well layer 112p1, and the second photoluminescent quantum well layer 112p2 are alternately stacked.

Referring to FIG. 5 again, the opening O of the light emitting diode 500 penetrates the first spacer 518a1, the first photoluminescent quantum well layer 112p1, the second spacer 518a2, the second photoluminescent quantum well layer 112p2, and a portion of the first type doped semiconductor layer 512a of the first light emitting unit 512a1. The conductive plug 10 is located in the opening O and forms an ohmic contact with the first type doped semiconductor layer 512a of the first light emitting unit 512a1, so as to electrically connect the first light emitting unit 512a1. The insulating layer 550 is disposed on the sidewalls of the opening O and a surface of the first spacer 518a1.

Specifically, in this embodiment, the electroluminescent quantum well layer 112e emits a light beam with a range of wavelength from 420 nanometers to 500 nanometers. The first photoluminescent quantum well layer 112p1 emits a light beam with a range of wavelength from 600 nanometers to 750 nanometers, and the second photoluminescent layer 112p2 emits a light beam with a range of wavelength from 500 nanometers to 600 nanometers. In other embodiments, the first photoluminescent quantum well layer 112p1 may also emit a light beam with a range of wavelength from 500 nanometers to 600 nanometers, while the second photoluminescent quantum well layer 112p2 may emit a light beam with a range of wavelength from 600 nanometers to 750 nanometers. Specifically, in this embodiment, after a voltage is applied to the light emitting diode 500 of this embodiment to inject a current, the electroluminescent quantum well layer 112e emits a light beam with a range of wavelength from 420 nanometers to 500 nanometers after being excited by the current. The first photoluminescent quantum well layer 112p1 and the second photoluminescent quantum well layer 112p2 absorb a portion of the light beam emitted by the electroluminescent quantum well layer 112e, and the photoluminescent quantum well layers are respectively excited to emit the light beams with the corresponding ranges of wavelength. In other words, the light beam emitted by the electroluminescent quantum well layer 112e of this embodiment after a voltage is applied to inject a current excites the first photoluminescent quantum well layer 112p1 and the second photoluminescent quantum well layer 112p2 stacked on the same substrate. In other words, the light emitting diode 500 of this embodiment is a white light emitting diode having a spectrum with three wavelength peaks.

It should be noted that the three wavelength peaks in the spectrum of the white light emitted by the light emitting diode 500 are from the light beams emitting by the quantum well layers. In addition, the intensities of the three wavelength peaks (red light, green light, and blue light) may consistently increase or decrease with increase/decrease of the injected current. Thus, color properties (e.g., color temperature, color rendering index, or other color properties) of the white light emitted by the light emitting diode 500 do not change as the driving voltage changes. Moreover, compared with the conventional white light emitting diode using red, green, and blue light emitting chips, since the light emitting mechanism of the photoluminescent quantum well layer is fluorescence, the lifetime of fluorescence is approximately in a range from $10^{-11}$ to $10^{-7}$ seconds. Thus, the light emitting diode 500 of this embodiment is also suitable for a visible light communication system, and may serve as a data transmission module with a high bit rate in the visible light communication system. The light emitting diode further has a lower cost and higher reliability compared with the conventional white light emitting diode using red, green, and blue light emitting chips.

Figure 6:
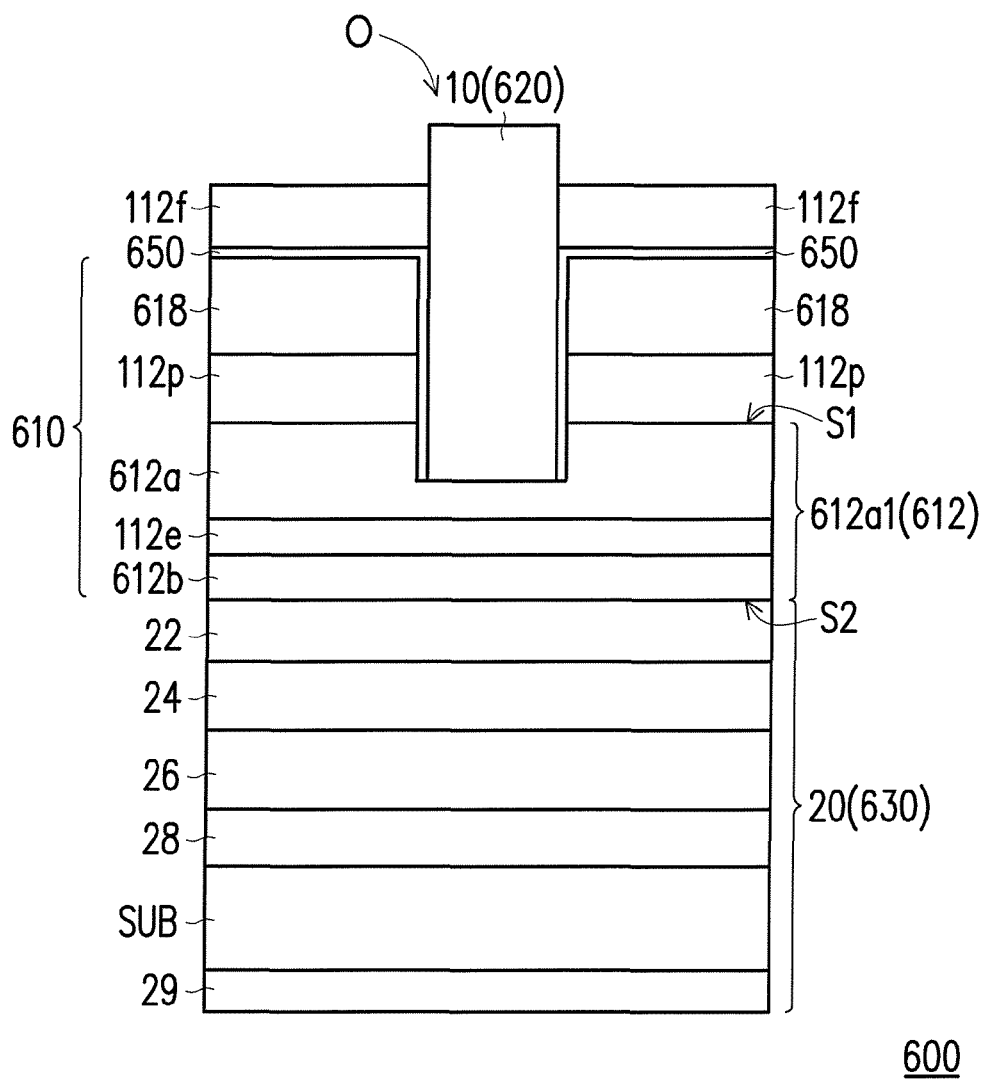

FIG. 6 is a cross-sectional schematic view illustrating a light emitting diode according to another embodiment of the invention. A light emitting diode 600 of FIG. 6 and the light emitting diode 500 shown in FIG. 5 are similar, except for a main difference that the wavelength conversion layers of the light emitting layers include a photoluminescent quantum well layer 112p and the phosphor layer 112f, and a spacer 618 is located between the photoluminescent quantum well layer 112p and the phosphor layer 112f. The opening O penetrates the phosphor layer 112, the spacer 618, the photoluminescent quantum well layer 112p, and a portion of a first type doped semiconductor layer 612a of a first light emitting unit 612a1.

Specifically, in this embodiment, the electroluminescent quantum well layer 112e emits a light beam with a range of wavelength from 420 nanometers to 500 nanometers. The photoluminescent quantum well layer 112*p* emits a light beam with a range of wavelength from 500 nanometers to 600 nanometers. The phosphor layer 112*f* emits a light beam with a range of wavelength from 600 nanometers to 750 nanometers. Specifically, after a voltage is applied to the light emitting diode 600 to inject a current, the electroluminescent quantum well layer 112*e* is excited by the current and emits a light beam with a range of wavelength from 420 nanometers to 500 nanometers. After the photoluminescent quantum well layer 112*p* and the phosphor layer 112*f* absorb the light beam emitted by the electroluminescent quantum well layer 112*e*, the photoluminescent quantum well layer 112*p* and the phosphor layer 112*f* are respectively excited to emit a light beam with a range of wavelength from 500 nanometers to 600 nanometers and a light beam with a range of wavelength from 600 nanometers to 750 nanometers. In other words, after a voltage is applied to the light emitting diode 600 of this embodiment to inject a current, a portion of the light beam emitted by the electroluminescent quantum well layer 112*e* excited by the current excites the photoluminescent quantum well layer 112*p* and the phosphor layer 112*f* stacked on the same substrate. In other words, the light emitting diode 600 of this embodiment is a white light emitting diode having a spectrum with three wavelength peaks.

Figure 7:
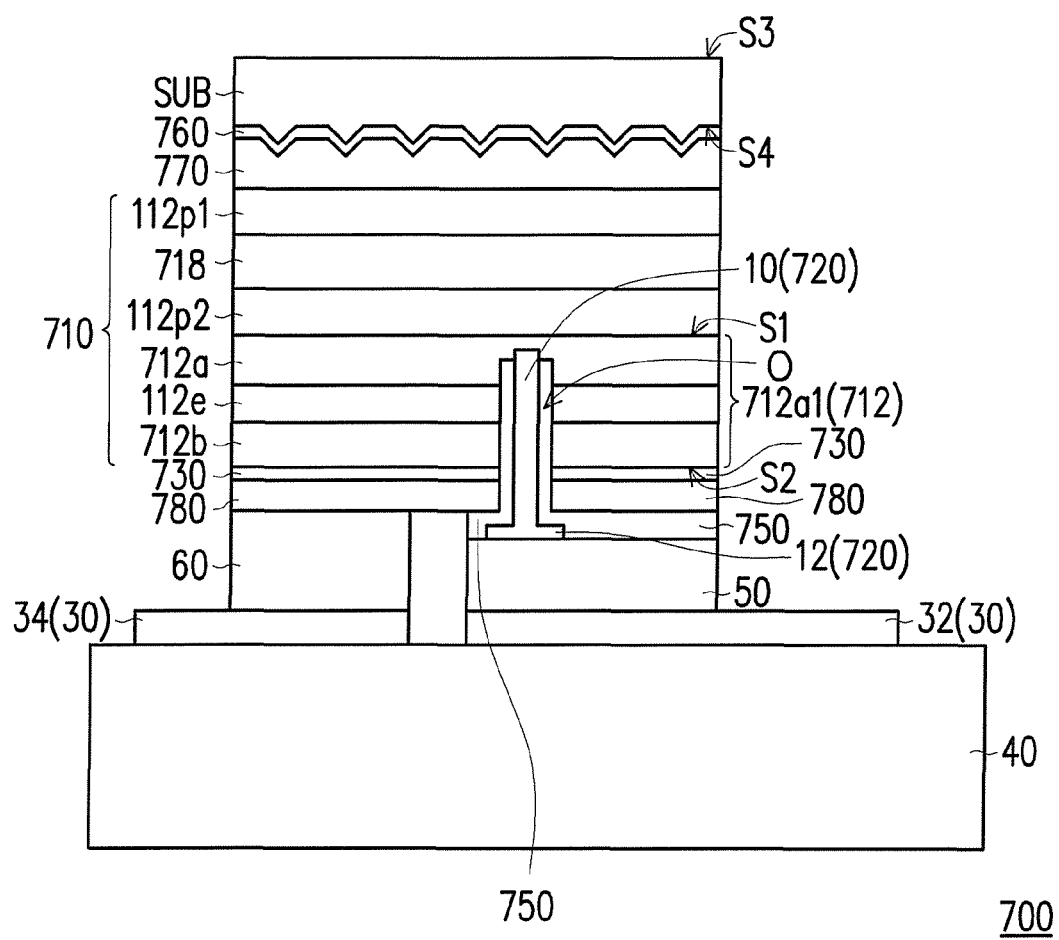

FIG. 7 is a cross-sectional schematic view illustrating a light emitting diode according to another embodiment of the invention. A light emitting diode 700 shown in FIG. 7 and the light emitting diode 400 shown in FIG. 4 are similar, except for a main difference that the light emitting layers include the electroluminescent quantum well layer 112*e* and the wavelength conversion layers. More specifically, the wavelength conversion layers include a first photoluminescent quantum well layer 112*p*1 and a second photoluminescent quantum well layer 112*p*2. In addition, the electroluminescent quantum well layer 112*e* is located between a first type doped semiconductor layer 712*a* and a second type doped semiconductor layer 712*b*. In other words, the electroluminescent quantum well layer 112*e*, the first type doped semiconductor layer 712*a*, and the second type doped semiconductor layer 712*b* may be considered as one light emitting unit 712. In other words, the light emitting diode 700 has a first light emitting unit 712*a*1. The light emitting unit 712*a*1 has the first surface S1 and the second surface S2 opposite to the first surface S1. The second photoluminescent quantum well layer 112*p*2 is located between the first photoluminescent quantum well layer 112*p*1 and the first light emitting unit 712*a*1. The buffer layer 770 is located between the first photoluminescent quantum well layer 112*p*1 and the nucleation layer 760.

Referring to FIG. 7 again, a first electrode 720 and a second electrode 730 are electrically connected to the first light emitting unit 712*a*1. The opening O penetrates a metal reflective layer 780, the second electrode 730, and the second type doped semiconductor layer 712*b* in the first light emitting unit 712*a*1, the electroluminescent quantum well layer 712*e*, and a portion of the first type doped semiconductor layer 712*a* in the first light emitting unit 712*a*1. The conductive plug 10 is located in the opening O and forms an ohmic contact with the first type doped semiconductor layer 712*a* of the first light emitting unit 712*a*1, so as to electrically connect the first light emitting unit 712*a*1.

In the light emitting diode 700 of this embodiment, light beams emitted by the electroluminescent quantum well layer 112*e*, the first photoluminescent quantum well layer 112*p*1, and the second photoluminescent quantum well layer 112*p*2 and ranges of wavelength of the light beams thereof correspond to the light beams emitted by the electroluminescent quantum well layer 112*e*, the first photoluminescent quantum well layer 112*p*1, and the second photoluminescent quantum well layer 112*p*2 of the light emitting diode 500 shown in FIG. 5 and the ranges of wavelength thereof. Thus, repeated contents will not be reiterated in the following.

Figure 8:
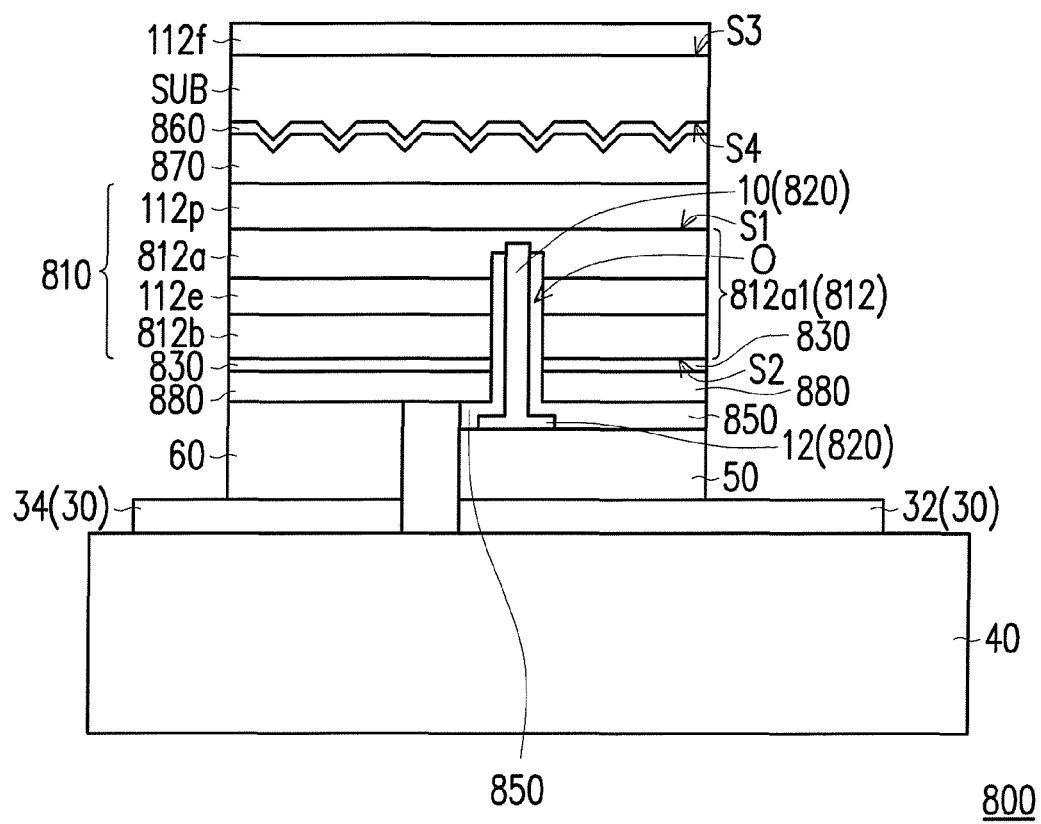

FIG. 8 is a cross-sectional schematic view illustrating a light emitting diode according to another embodiment of the invention. A light emitting diode 800 shown in FIG. 8 and the light emitting diode 700 shown in FIG. 7 are similar, except for a main difference that the wavelength conversion layers of the light emitting layers include the photoluminescent quantum well layer 112*p* and the phosphor layer 112*f*. In addition, a buffer layer 870, a nucleation layer 860, and the substrate SUB are located between the photoluminescent quantum well layer 112*p* and the phosphor layer 112*f*. In addition, the phosphor layer 112*f* is located on the third surface S3 of the substrate SUB, and the photoluminescent quantum well layer 112*p* is located between a first light emitting unit 812*a*1 and the buffer layer 870.

In the light emitting diode 800 of this embodiment, light beams emitted by the electroluminescent quantum well layer 112*e*, the photoluminescent quantum well layer 112*p*, and the phosphor layer 112*f* and ranges of wavelength thereof correspond to the light beams emitted by the electroluminescent quantum well layer 112*e*, the photoluminescent quantum well layer 112*p*, and the phosphor layer 112*f* of the light emitting diode 600 of FIG. 6 and the ranges of wavelength thereof. Thus, repeated contents will not be reiterated in the following.

Figure 9:
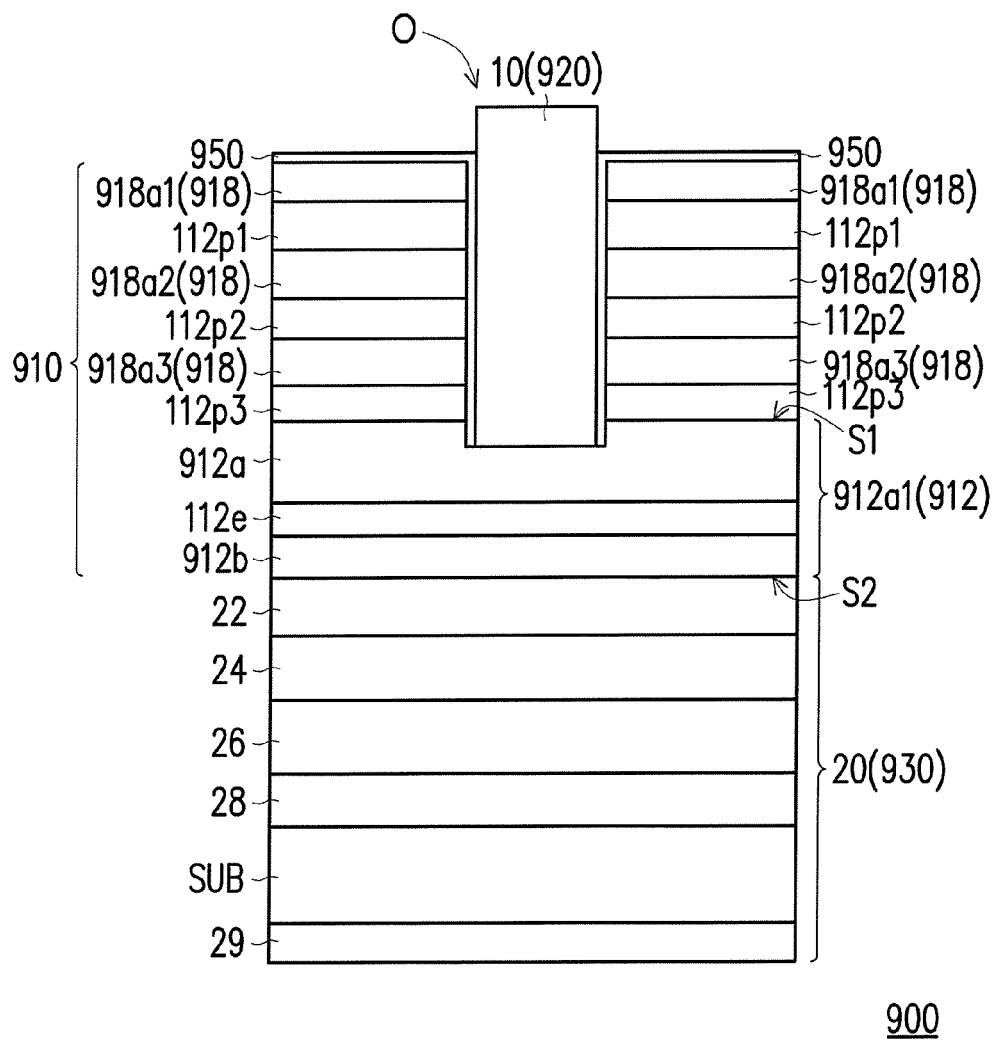

FIG. 9 is a cross-sectional schematic view illustrating a light emitting diode according to another embodiment of the invention. A light emitting diode 900 shown in FIG. 9 and the light emitting diode 500 shown in FIG. 5 are similar, except for a main difference that, in addition to the first photoluminescent quantum well layer 112*p*1 and the second photoluminescent quantum well layer 112*p*2, the wavelength conversion layers further include a third photoluminescent quantum well layer 112*p*3. In addition, a semiconductor epitaxial structure 910 further includes a third spacer 918*a*3 in addition to a first spacer 918*a*1 and a second spacer 918*a*2. The third photoluminescent quantum well layer 112*p*3 is located between the second photoluminescent quantum well layer 112*p*2 and a first light emitting unit 912*a*1. The second photoluminescent quantum well layer 112*p*2 is located between the first photoluminescent quantum well layer 112*p*1 and the third photoluminescent quantum well layer 112*p*3. The first spacer 918*a*1 is located at a side of the first photoluminescent quantum well layer 112*p*1, and the second spacer 918*a*2 is located at the other side of the first photoluminescent quantum well layer 112*p*1. In addition, the second spacer 918*a*2 is located between the first photoluminescent quantum well layer 112*p*1 and the second photoluminescent quantum well layer 112*p*2. The third spacer 918*a*3 is located between the second photoluminescent quantum well layer 112*p*2 and the third photoluminescent quantum well layer 112*p*3. In other words, the spacers 918 and the first photoluminescent quantum well layer 112*p*1, the second photoluminescent quantum well layer 112*p*2, and the third photoluminescent quantum well layer 112*p*3 are alternately stacked.

Referring to FIG. 9 again, the opening O of the light emitting diode 900 penetrates the first spacer 918*a*1, the first photoluminescent quantum well layer 112*p*1, the second spacer 918*a*2, the second photoluminescent quantum well layer 112*p*2, the third spacer 918*a*3, the third photoluminescent quantum well layer 112p3, and a portion of a first type doped semiconductor layer 912a of the first light emitting unit 912a1.

Specifically, in this embodiment, the electroluminescent quantum well layer 112e emits a light beam with a range of wavelength from 320 nanometers to 420 nanometers (a range of wavelength of violet light). The first photoluminescent quantum well layer 112p1 emits a light beam with a range of wavelength from 600 nanometers to 750 nanometers. The second photoluminescent quantum well layer 112p2 emits a light beam with a range of wavelength from 500 nanometers to 600 nanometers. The third photoluminescent quantum well layer 112p3 emits a light beam with a range of wavelength from 420 nanometers to 500 nanometers. Specifically, after a voltage is applied to the light emitting diode 900 of this embodiment to inject a current, a portion of the light beam emitted by the electroluminescent quantum well layer 112e after being excited by the current is absorbed by the first photoluminescent quantum well layer 112p1, the second photoluminescent quantum well layer 112p2, and the third photoluminescent quantum well layer 112p3, and the photoluminescent quantum well layers are respectively excited to emit the light beams with the ranges of wavelength disclosed above. In other words, the light beam emitted by the electroluminescent quantum well layer 112e after a voltage is applied to inject a current excites the first photoluminescent quantum well layer 112p1, the second photoluminescent quantum well layer 112p2, and the third photoluminescent quantum well layer 112p3 to make the light emitting diode 900 a white light emitting diode with a spectrum having four wavelength peaks.

Figure 10:
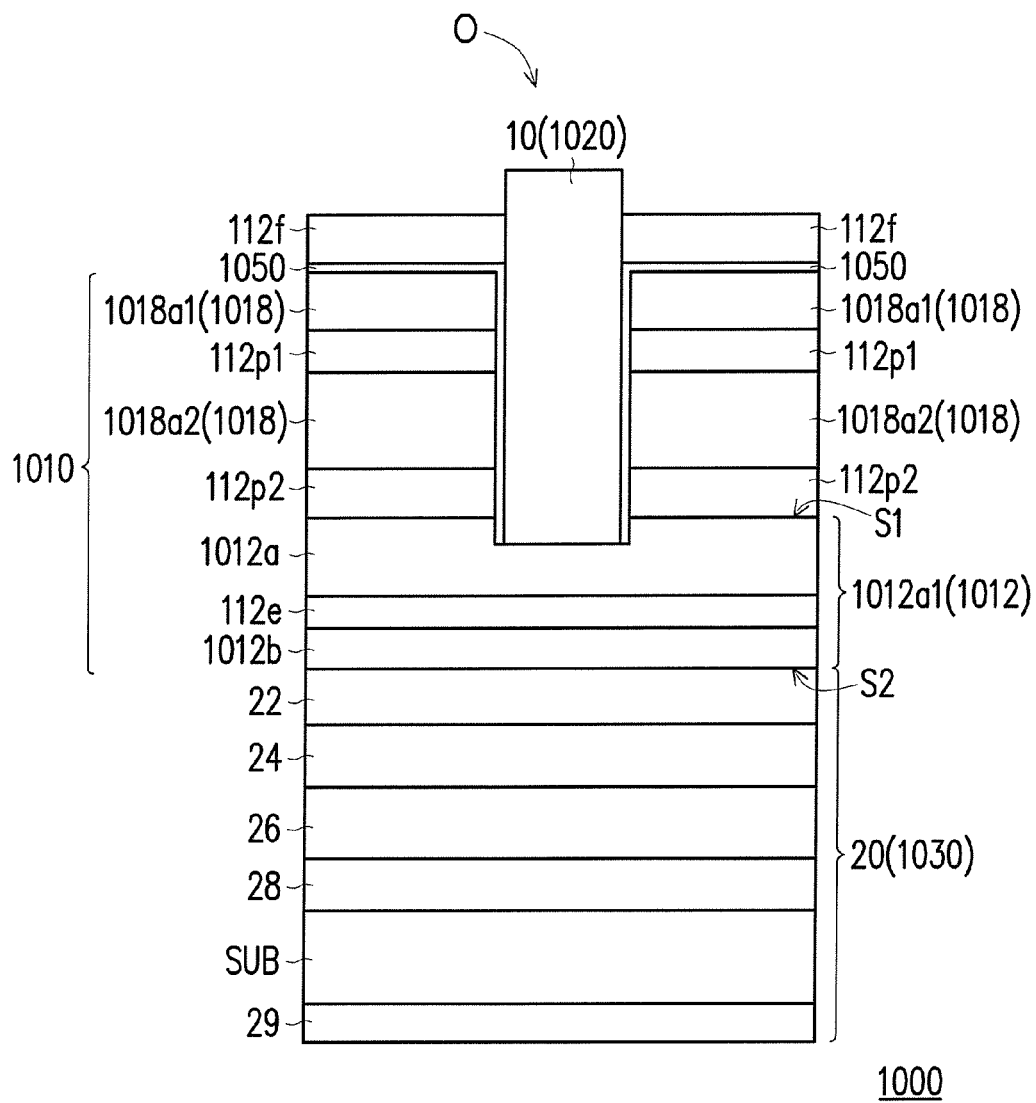

FIG. 10 is a cross-sectional schematic view illustrating a light emitting diode according to another embodiment of the invention. A light emitting diode 1000 shown in FIG. 10 and the light emitting diode 500 shown in FIG. 5 are similar, except for a main difference that the light emitting layers further includes the phosphor layer 112f, and the phosphor layer 112f is located on a first spacer 1018a1. In addition to penetrating the first spacer 1018a1, the first photoluminescent quantum well layer 112p1, a second spacer 1018a2, the second photoluminescent quantum well layer 112p2, and a portion of a first type doped semiconductor layer 1012a of a first light emitting unit 1012a1, the opening O further penetrates the phosphor layer 112f, the first spacer 1018a1, the first photoluminescent quantum well layer 112p1, the second spacer 1018a2 and the second photoluminescent quantum well layer 112p2. In addition, the bottom of the opening O may be formed in the first type doped semiconductor layer 1012a.

Besides, in the light emitting diode 1000 of this embodiment, the electroluminescent quantum well layer 112e emits a light beam with a range of wavelength from 320 nanometers to 420 nanometers. The first photoluminescent quantum well layer 112p1 emits a light beam with a range of wavelength from 500 nanometers to 600 nanometers, and the second photoluminescent layer 112p2 emits a light beam with a range of wavelength from 420 nanometers to 500 nanometers. The phosphor layer 112f emits a light beam with a range of wavelength from 600 nanometers to 750 nanometers. Specifically, after a voltage is applied to the light emitting diode 1000 of this embodiment to inject a current, the light beam emitted by the electroluminescent quantum well layer 112e after being excited by the current is partially absorbed by the first photoluminescent quantum well layer 112p1, the second photoluminescent quantum well layer 112p2, and the phosphor layer 112f, and the photoluminescent quantum well layers and the phosphor layer are respectively excited to emit the light beams with the corresponding ranges of wavelength.

Figure 11:
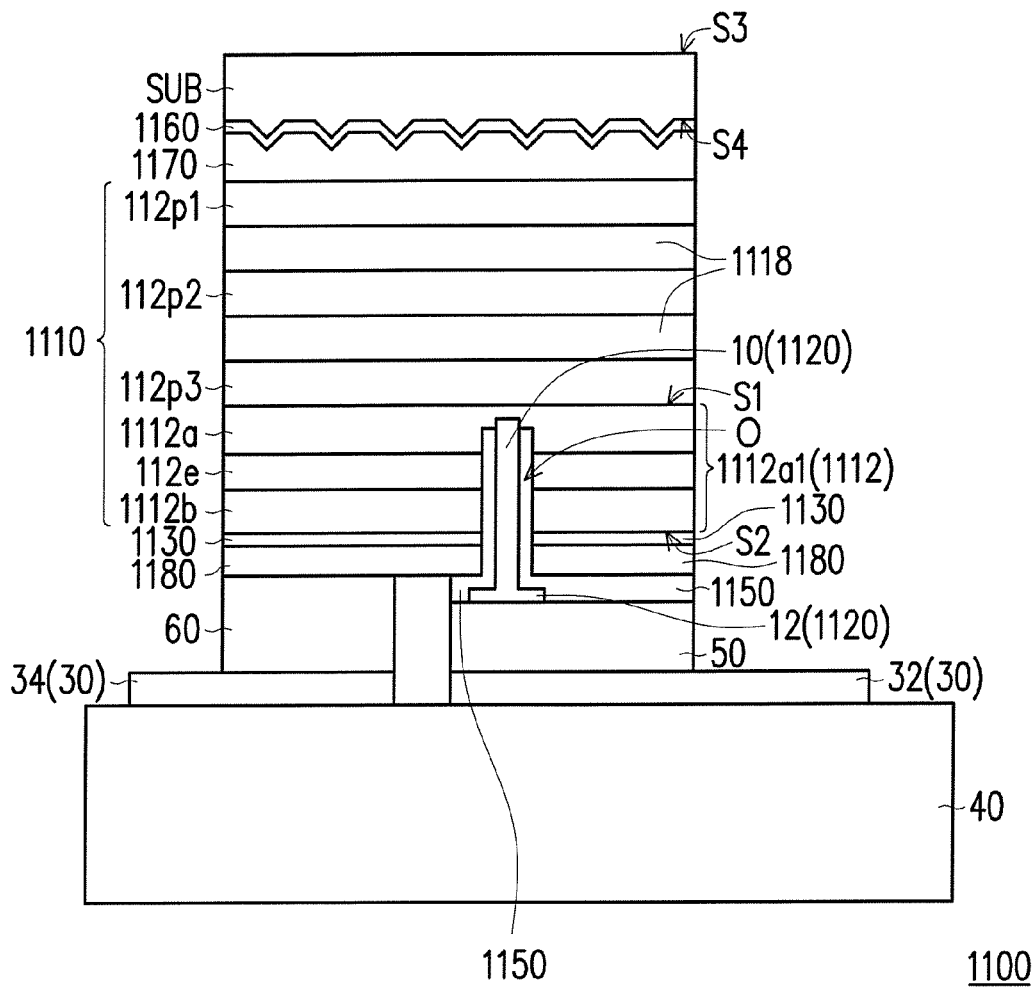

FIG. 11 is a cross-sectional schematic view illustrating a light emitting diode according to another embodiment of the invention. A light emitting diode 1100 shown in FIG. 11 and the light emitting diode 700 shown in FIG. 7 are similar, except for a main difference that, in addition to the first photoluminescent quantum well layer 112p1 and the second photoluminescent quantum well layer 112p2, the wavelength conversion layers further include the third photoluminescent quantum well layer 112p3. In this embodiment, the number of the spacers 1118 is two, for example, namely the first spacer 1118a1 and the second spacer 1118a2. The first spacer 1118a1 is located between the first photoluminescent quantum well layer 112p1 and the second photoluminescent quantum well layer 112p2. The second spacer 1018a2 is located between the second photoluminescent quantum well layer 112p2 and the third photoluminescent quantum well layer 112p3.

Besides, in the light emitting diode 1000 of this embodiment, light beams emitted by the electroluminescent quantum well layer 112e, the first photoluminescent quantum well layer 112p1, the second photoluminescent quantum well layer 112p1, and the third photoluminescent quantum well layer 112p3 and ranges of wavelength thereof correspond to the light beams emitted by the electroluminescent quantum well layer 112e, the first photoluminescent quantum well layer 112p1, the second quantum well layer 112p1, and the third photoluminescent quantum well layer 112p3 of the light emitting diode 900 shown in FIG. 9 and the ranges of wavelength thereof. Thus, repeated contents will not be reiterated in the following.

Figure 12:
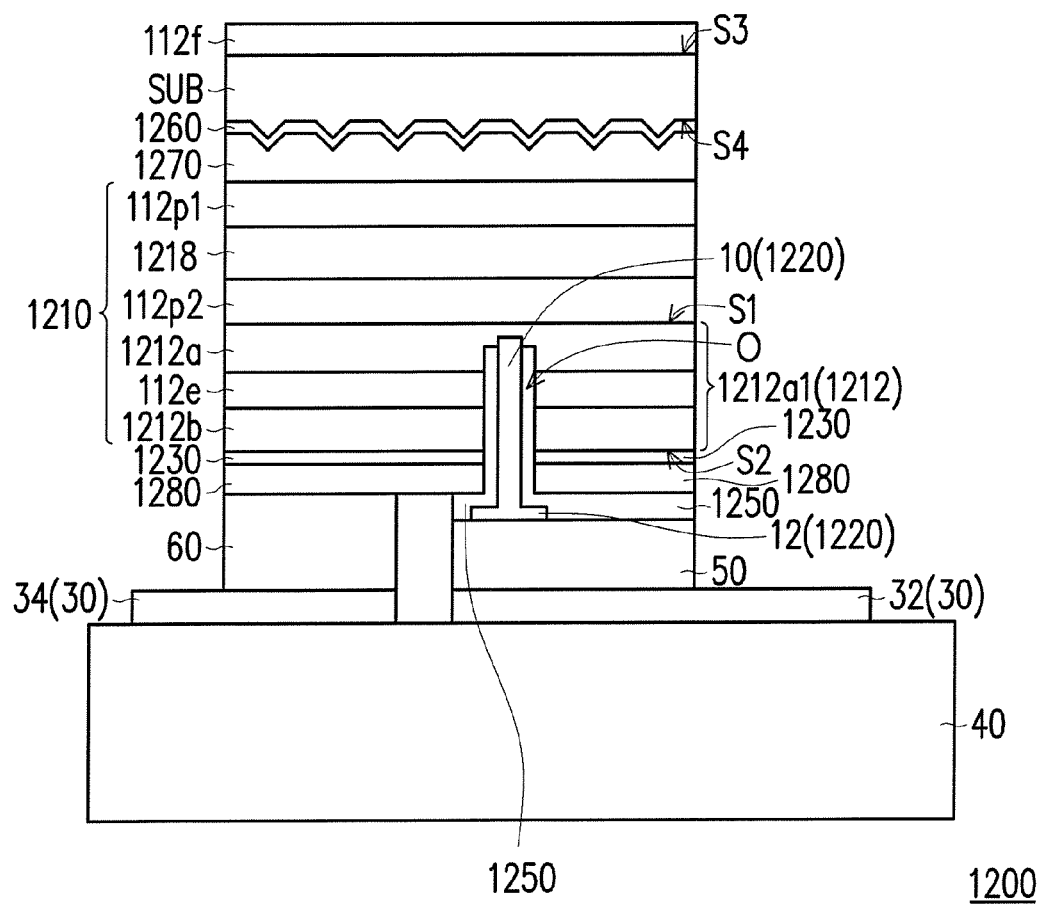

FIG. 12 is a cross-sectional schematic view illustrating a light emitting diode according to another embodiment of the invention. A light emitting diode 1200 shown in FIG. 12 and the light emitting diode 700 shown in FIG. 7 are similar, except for a main difference that the light emitting layers 112 further includes the phosphor layer 112f, and the phosphor layer 112f is located on the third surface S3 of the substrate SUB.

Besides, in the light emitting diode 1200 of this embodiment, light beams emitted by the electroluminescent quantum well layer 112e, the first photoluminescent quantum well layer 112p1, the second photoluminescent quantum well layer 112p2, and the phosphor layer 112f and ranges of wavelength of the light beams thereof respectively correspond to the light beams emitted by the electroluminescent quantum well layer 112e, the first photoluminescent quantum well layer 112p1, the second photoluminescent quantum well layer 112p2, and the phosphor layer 112f of the light emitting diode 1000 shown in FIG. 10 and the ranges of wavelength thereof. Thus, repeated contents will not be reiterated in the following.

Figure 13:
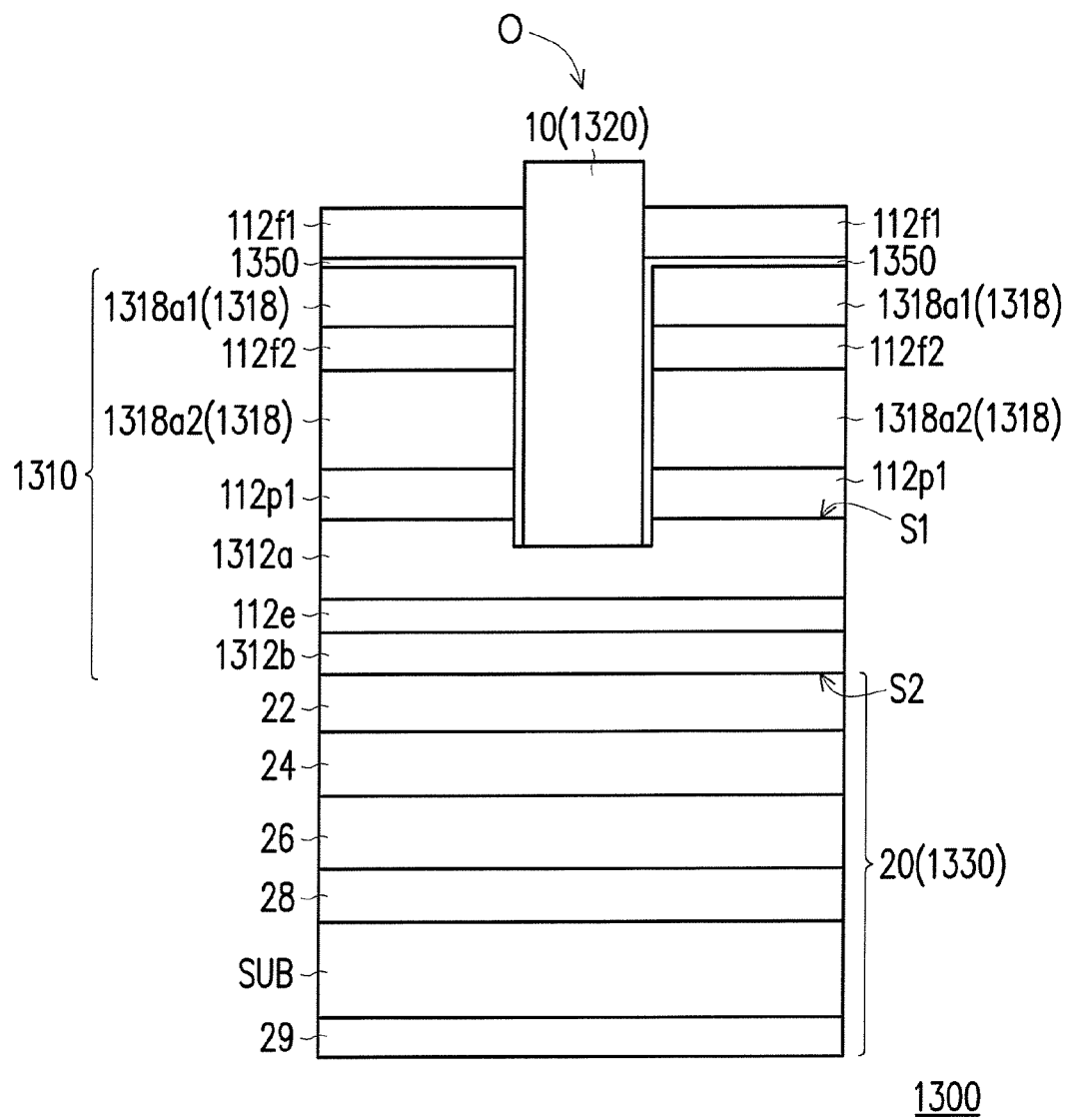

FIG. 13 is a cross-sectional schematic view illustrating a light emitting diode according to another embodiment of the invention. A light emitting diode 1300 shown in FIG. 13 and the light emitting diode 1000 shown in FIG. 10 are similar, except for a main difference that the wavelength conversion layers include the first photoluminescent quantum well layer 112p1, the first phosphor layer 112f1, and a second phosphor layer 112f2. In addition, positions of the first photoluminescent quantum well layer 112p1, the first phosphor layer 112f1, and the second phosphor layer 112f2 respectively correspond to the second photoluminescent quantum well layer 112p2, the first photoluminescent quantum well layer 112p1, and the phosphor layer 112f of the light emitting diode 1000 shown in FIG. 10. A first spacer 1318a1 is located between the first phosphor layer 112f1 and the second phosphor layer 112f2. The second spacer 1318a2 is located between the first photoluminescent quantum well layer 112p1 and the second phosphor layer 112f2. Details concerning the relations of positions will not be further described in the following.

Besides, in the light emitting diode 1300 of this embodiment, light beams emitted by the electroluminescent quantum well layer 112e, the first photoluminescent quantum well layer 112p1, the second phosphor layer 112f2, and the first phosphor layer 112f1 and ranges of wavelength thereof respectively correspond to the light beams emitted by the electroluminescent quantum well layer 112e, the first photoluminescent quantum well layer 112p1, the second photoluminescent quantum well layer 112p2, and the phosphor layer 112f emitted by the light emitting diode 1000 shown in FIG. 10 and the ranges of wavelength thereof. Thus, repeated contents will not be reiterated in the following. In addition, a material of the second phosphor layer 112f2 includes a green light phosphor capable of emitting a light beam with a range of wavelength from 500 nanometers to 600 nanometers.

Figure 14:
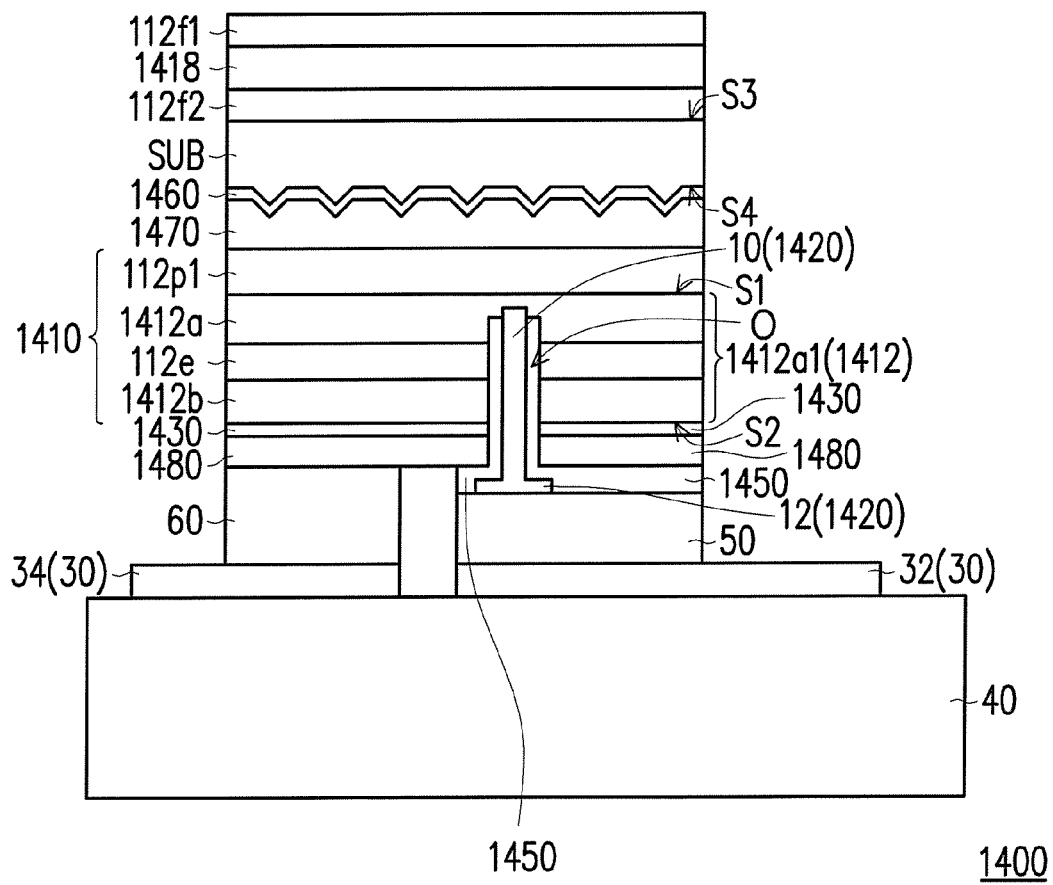

FIG. 14 is a cross-sectional schematic view illustrating a light emitting diode according to another embodiment of the invention. A light emitting diode 1400 shown in FIG. 14 and the light emitting diode 1200 shown in FIG. 12 are similar, except for a main difference that the wavelength conversion layers include the first photoluminescent quantum well layer 112p1, the first phosphor layer 112f1, and the second phosphor layer 112f2. In addition, the first photoluminescent quantum well layer 112p1 is located between a buffer layer 1470 and a first light emitting unit 1412a1, and the first phosphor layer 112f1 and the second phosphor layer 112f2 are located on the third surface S3 of the substrate SUB. A spacer 1418 is further disposed between the first phosphor layer 112f1 and the second phosphor layer 112f2, so as to separate the first phosphor layer 112f1 and the second phosphor layer 112f2.

Besides, in the light emitting diode 1400 of this embodiment, light beams emitted by the electroluminescent quantum well layer 112e, the first photoluminescent quantum well layer 112p1, the second phosphor layer 112f2, and the first phosphor layer 112f1 and ranges of wavelength thereof respectively correspond to the light beams emitted by the electroluminescent quantum well layer 112e, the first photoluminescent quantum well layer 112p1, the second phosphor layer 112f2, and the first phosphor layer 112f1 and the ranges of wavelength thereof. Thus, repeated contents will not be reiterated in the following.

Figure 15:
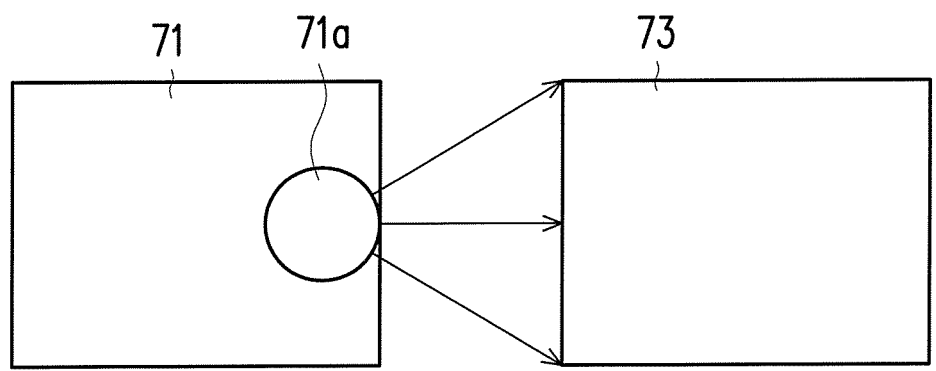
FIG. 15 is a schematic view illustrating a data transmission and reception apparatus according to an embodiment of the invention.

FIG. 15 is a schematic view illustrating a data transmission and reception apparatus suitable for the light emitting diodes in the embodiments of the invention. In this embodiment, a data transmission and reception apparatus 70 includes a data transmission module 71 and a data reception module 73. The data transmission module 71 includes one or more light emitting diodes 71a. In addition, the one or more light emitting diodes 71a may be chosen from the light emitting diodes of the embodiments of the invention, and the data transmission module 71 controls optical properties of the one or more light emitting diodes 71a. The data reception module 73 receives light beams emitted by the one or more light emitting diodes 71a. The data transmission and reception apparatus 70 including the data transmission module 71 and the data reception module 73 adopts the operation mode disclosed in US Patent Publication No. 2009/0214225 A1, for example. In an embodiment, the distance between the data transmission module 71 and the data reception module 73 is, for example, less than 50 meters.

In addition, the data transmission and reception apparatus 70 of this embodiment uses one of the light emitting diodes of the embodiments of the invention. Since the light emitting diode according to the embodiments of the invention has a higher modulation bandwidth, the light emitting diode according to the embodiments of the invention is suitable for a data emission module with a higher bit rate. In addition, the data transmission and reception apparatus 70 may be used with a wavelength division multiplexing (WDM) apparatus, so that the light beams with different wavelengths emitted by the quantum well layers in the above embodiments may carry different signals. Thus, the data transmission and reception apparatus 70 in the embodiment of the invention is suitable for a visible light communication system.

Based on above, in the light emitting diode according to the embodiments of the invention, a plurality of the light emitting layers are disposed on one chip, and respectively emit light beams with different ranges of wavelength. In addition, at least two light beams with different ranges of wavelength are from the quantum well layers. Thus, the light emitting diode according to the embodiments of the invention has a higher modulation bandwidth and is suitable for a visible light communication system. Moreover, the light beams emitted by the light emitting diode according to the embodiments of the invention have a higher reliability and the light emitting diode according to the embodiments of the invention does not require a complex driving circuit. Thus, the light emitting diode according to the embodiments of the invention has a lower production cost. Furthermore, the light emitting diode according to the embodiments of the invention is suitable to be a light emitting diode of any form according to different needs of the user. In other words, the light emitting diode according to the embodiments of the invention is suitable to be a horizontal light emitting diode, a vertical light emitting diode, a flip-chip light emitting diode, or a light emitting diode of other kinds. In addition, the data transmission and reception apparatus according to the embodiments of the invention uses the light emitting diode according to the embodiments of the invention as the data transmission module and is suitable for a visible light communication system.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode chip, applied to a visible light communication system, the light emitting diode chip comprising:
   a semiconductor epitaxial structure comprising a plurality of stacked light emitting layers for emitting a spectrum with at least three wavelength peaks, the stacked light emitting layers comprising at least two quantum well layers for emitting at least two of the wavelength peaks, an electroluminescent quantum well layer and a plurality of wavelength conversion layers;
   a first electrode, electrically connected to the semiconductor epitaxial structure; and
   a second electrode, electrically connected to the semiconductor epitaxial structure.

2. The light emitting diode chip as claimed in claim 1, wherein the semiconductor epitaxial structure further comprises:
   a first type doped semiconductor layer; and
   a second type doped semiconductor layer, wherein the light emitting layers are stacked between the first type doped semiconductor layer and the second type doped semiconductor layer.

3. The light emitting diode chip as claimed in claim 2, wherein the semiconductor epitaxial structure further comprises a plurality of spacers, and each of the spacers is located between adjacent light emitting layers.

4. The light emitting diode chip as claimed in claim 2, wherein the light emitting layers comprise a first light emitting layer, a second light emitting layer, and a third light emitting layer, and the first light emitting layer, the second light emitting layer, and the third light emitting layer respectively emit a light beam with a range of wavelength from 600 nanometers to 750 nanometers, a light beam with a range of wavelength from 500 nanometers to 600 nanometers, and a light beam with a range of wavelength from 420 nanometers to 500 nanometers.

5. The light emitting diode chip as claimed in claim 1, wherein the semiconductor epitaxial structure comprises a plurality of stacked light emitting units, and each of the light emitting units comprises:
   a first type doped semiconductor layer; and
   a second type doped semiconductor layer, wherein each of the light emitting layers is located between the first type doped semiconductor layer and the second type doped semiconductor layer.

6. The light emitting diode chip as claimed in claim 5, wherein the light emitting layers in each of the light emitting units respectively emit a light beam with a range of wavelength from 600 nanometers to 750 nanometers, a light beam with a range of wavelength from 500 nanometers to 600 nanometers, and a light beam with a range from 420 nanometers to 500 nanometers.

7. The light emitting diode chip as claimed in claim 5, wherein one of the light emitting layers comprises a wavelength conversion layer, while remaining of the light emitting layers comprise a plurality of electroluminescent quantum well layers.

8. The light emitting diode chip as claimed in claim 7, wherein the electroluminescent quantum well layers comprise a first electroluminescent quantum well layer and a second electroluminescent quantum well layer.

9. The light emitting diode chip as claimed in claim 5, wherein the semiconductor epitaxial structure further comprises a plurality of tunnel junction layers, and each of the tunnel junction layers is located between adjacent light emitting units.

10. The light emitting diode chip as claimed in claim 1, wherein the light emitting diode further comprises:
    a first type doped semiconductor layer; and
    a second type doped semiconductor layer, wherein the electroluminescent quantum well layer is located between the first type doped semiconductor layer and the second type doped semiconductor layer.

11. The light emitting diode chip as claimed in claim 1, wherein the electroluminescent quantum well layer emits a light beam with a range of wavelength from 420 nanometers to 500 nanometers, and the wavelength conversion layers respectively emit a light beam with a range of wavelength from 500 nanometers to 600 nanometers and a light beam with a range of wavelength from 600 nanometers to 750 nanometers.

12. The light emitting diode chip as claimed in claim 11, wherein the wavelength conversion layers comprise a first photoluminescent quantum well layer and a second photoluminescent quantum well layer.

13. The light emitting diode chip as claimed in claim 11, wherein the wavelength conversion layers comprise a first photoluminescent quantum well layer and a phosphor layer.

14. The light emitting diode chip as claimed in claim 1, wherein the electroluminescent quantum well layer emits a light beam with a range of wavelength from 320 nanometers to 420 nanometers, and the wavelength conversion layers respectively emit a light beam with a range of wavelength from 420 nanometers to 500 nanometers, a light beam with a range of wavelength from 500 nanometers to 600 nanometers, and a light beam with a range of wavelength from 600 nanometers to 750 nanometers.

15. The light emitting diode chip as claimed in claim 14, wherein the wavelength conversion layers comprise a first photoluminescent quantum well layer, a second photoluminescent quantum well layer, and a third photoluminescent quantum well layer.

16. The light emitting diode chip as claimed in claim 14, wherein the wavelength conversion layers comprise a first photoluminescent quantum well layer, a phosphor layer, and a second phosphor layer.

17. The light emitting diode chip as claimed in claim 14, wherein the wavelength conversion layers comprise a first photoluminescent quantum well layer, a second photoluminescent quantum well layer, and a phosphor layer.

18. A data transmission and reception apparatus, comprising:
    a data transmission module, wherein the data transmission module comprises at least one light emitting diode chip as claimed in claim 1; and
    a data reception module, wherein the data reception module receives a light beam emitted by the at least one light emitting diode chip.

19. The data transmission and reception apparatus as claimed in claim 18, wherein the distance between the data transmission module and the data reception module is less than 50 meters.

20. A light emitting diode chip, applied to a visible light communication system, the light emitting diode chip comprising:
    a semiconductor epitaxial structure comprising a plurality of tunnel junction layers, a plurality of stacked light emitting layers for emitting a spectrum with at least three wavelength peaks, the stacked light emitting layers comprising at least two quantum well layers for emitting at least two of the wavelength peaks, a plurality of stacked light emitting units, each of the tunnel junction layers is located between adjacent light emitting units, wherein each of the light emitting units comprises:
    a first type doped semiconductor layer; and
    a second type doped semiconductor layer, wherein each of the light emitting layers is located between the first type doped semiconductor layer and the second type doped semiconductor layer;
    a first electrode, electrically connected to the semiconductor epitaxial structure; and
    a second electrode, electrically connected to the semiconductor epitaxial structure.

* * * * *